United States Patent
Comiskey et al.

(10) Patent No.: US 6,473,072 B1
(45) Date of Patent: Oct. 29, 2002

(54) MICROENCAPSULATED ELECTROPHORETIC ELECTROSTATICALLY-ADDRESSED MEDIA FOR DRAWING DEVICE APPLICATIONS

(75) Inventors: Barrett Comiskey; Jonathan D. Albert, both of Cambridge; Joseph M. Jacobson, Newton Centre; Russell J. Wilcox, Natick; Paul Drzaic, Lexington, all of MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 09/310,300

(22) Filed: May 12, 1999

Related U.S. Application Data

(60) Provisional application No. 60/085,096, filed on May 12, 1998.

(51) Int. Cl.[7] .................................................. G09G 5/00
(52) U.S. Cl. ........................ 345/173; 345/107; 345/182
(58) Field of Search ............................... 345/173–183, 345/158, 107, 87; 178/18.01, 19.01, 19.03, 19.04, 19.05; 339/296

(56) References Cited

U.S. PATENT DOCUMENTS

| | | | |
|---|---|---|---|
| 2,766,478 A | 10/1956 | Raley, Jr. et al. | |
| 2,800,457 A | 7/1957 | Green et al. | 252/316 |
| 3,036,388 A | 5/1962 | Tate | 35/66 |
| 3,384,488 A | 5/1968 | Tulagin et al. | 96/88 |
| 3,389,194 A | 6/1968 | Somerville et al. | 264/4 |
| 3,406,363 A | 10/1968 | Tate | 335/302 |
| 3,423,489 A | 1/1969 | Arens et al. | 164/4 |
| 3,460,248 A | 8/1969 | Tate | 29/607 |
| 3,585,381 A | 6/1971 | Hodson et al. | 250/47 |
| 3,612,758 A | 10/1971 | Evans et al. | 178/5.4 |

(List continued on next page.)

FOREIGN PATENT DOCUMENTS

| | | |
|---|---|---|
| CH | 563807 | 7/1975 |
| DE | 4431441 C1 | 2/1996 |
| DE | 19500694 A1 | 8/1996 |
| EP | 0087193 A2 | 2/1983 |
| EP | 0 186 710 | 7/1986 |

(List continued on next page.)

OTHER PUBLICATIONS

Maierson, "Capsule Wall Treatment: Chemical Wall Sealing Process." In Microencapsulation Techniques: 156–193.
Sankus, "Electrophoretic Display Cell." Xerox Disclosure Journal 4 (3): 309 (May/Jun. 1979).
Purcell, "Liquid–Liquid Phase Separation." Microencapsulation With Synthetic Polymeric Film Formers.
Matrick, et al. "Encapsulated Pigments: Pigments and Paints." In Microcapsulation Techniques: 178–193.
Ballinger, "Magnetic Recording Paper Is Erasable." Electronics 46(5): 73–76 (Mar. 1, 1973).

(List continued on next page.)

Primary Examiner—Regina Liang
(74) Attorney, Agent, or Firm—Testa, Hurwitz & Thibeault, LLP

(57) ABSTRACT

A display includes an encapsulated display media, a rear electrode, and a movable electrode. The encapsulated display media comprises a plurality of capsules, each capsule comprising a plurality of particles dispersed in a fluid. The display media has a first surface and a second surface. The rear electrode is disposed adjacent the second surface of the display media. The movable electrode and the rear electrode apply an electric field across the display media.

68 Claims, 14 Drawing Sheets

U.S. PATENT DOCUMENTS

| | | | |
|---|---|---|---|
| 3,617,374 A | 11/1971 | Hodson et al. | 117/212 |
| 3,668,106 A | 6/1972 | Ota | 204/299 |
| 3,670,323 A | 6/1972 | Sobel et al. | 340/324 |
| 3,756,693 A | 9/1973 | Ota | 350/160 |
| 3,767,392 A | 10/1973 | Ota | 96/1 |
| 3,772,013 A | 11/1973 | Wells | 96/1.3 |
| 3,792,308 A | 2/1974 | Ota | 315/150 |
| 3,806,893 A | 4/1974 | Ohnishi et al. | 340/173 |
| 3,850,627 A | 11/1974 | Wells et al. | 96/1.3 |
| 3,870,517 A | 3/1975 | Ota et al. | 96/1.5 |
| 3,892,568 A | 7/1975 | Ota | 96/1.3 |
| 3,909,116 A | 9/1975 | Kohashi | 350/267 |
| 3,922,255 A | 11/1975 | Koestler et al. | 260/80.87 |
| 3,936,816 A | 2/1976 | Murata | 340/336 |
| 3,972,040 A | 7/1976 | Hilsum et al. | 340/324 |
| 4,001,140 A | 1/1977 | Foris et al. | 252/316 |
| 4,041,481 A | 8/1977 | Sato | 340/324 |
| 4,045,327 A | 8/1977 | Noma et al. | 204/299 |
| 4,062,009 A | 12/1977 | Raverdy et al. | 340/324 |
| 4,068,927 A | 1/1978 | White | 350/160 |
| 4,071,430 A | 1/1978 | Liebert | 204/299 |
| 4,087,376 A | 5/1978 | Foris et al. | 252/316 |
| 4,088,395 A | 5/1978 | Giglia | 350/357 |
| 4,093,534 A | 6/1978 | Carter et al. | 350/355 |
| 4,104,520 A | 8/1978 | Lewis et al. | 250/315 |
| 4,123,206 A | 10/1978 | Dannelly | 425/5 |
| 4,123,346 A | 10/1978 | Ploix | 204/299 |
| 4,126,528 A | 11/1978 | Chiang | 204/299 |
| 4,126,854 A | 11/1978 | Sheridon | 340/373 |
| 4,143,103 A | 3/1979 | Sheridon | 264/4 |
| 4,143,472 A | 3/1979 | Murata et al. | 35/66 |
| 4,147,932 A | 4/1979 | Lewis | 250/330 |
| 4,149,149 A | 4/1979 | Miki et al. | 340/753 |
| 4,166,800 A | 9/1979 | Foag | 252/316 |
| 4,185,621 A | 1/1980 | Morrow | 128/672 |
| 4,196,437 A | 4/1980 | Hertz | 346/1.1 |
| 4,201,691 A | 5/1980 | Asher et al. | 252/314 |
| 4,203,106 A | 5/1980 | Dalisa et al. | 340/787 |
| 4,211,668 A | 7/1980 | Tate | 252/316 |
| 4,218,302 A | 8/1980 | Dalisa et al. | 204/299 |
| 4,231,641 A | 11/1980 | Randin | 350/357 |
| 4,261,653 A | 4/1981 | Goodrich | 350/362 |
| 4,272,596 A | 6/1981 | Harbour et al. | 430/37 |
| 4,273,672 A | 6/1981 | Vassiliades | 252/316 |
| 4,279,632 A | 7/1981 | Frosch et al. | 65/21.4 |
| 4,285,801 A | 8/1981 | Chiang | 204/299 |
| 4,287,337 A | 9/1981 | Guglielmetti et al. | 544/6 |
| 4,298,448 A | 11/1981 | Muller et al. | 204/299 |
| 4,301,407 A | 11/1981 | Koslar | 324/96 |
| 4,303,433 A | 12/1981 | Torobin | 65/21.4 |
| 4,305,807 A | 12/1981 | Somlyody | 204/299 |
| 4,311,361 A | 1/1982 | Somlyody | 350/267 |
| 4,314,013 A | 2/1982 | Chang | 430/37 |
| 4,324,456 A | 4/1982 | Dalisa | 350/362 |
| 4,368,952 A | 1/1983 | Murata et al. | 350/362 |
| 4,390,403 A | 6/1983 | Batchelder | 204/180 |
| 4,418,346 A | 11/1983 | Batchelder | 340/787 |
| 4,419,383 A | 12/1983 | Lee | 427/47 |
| 4,422,082 A | 12/1983 | Louzil | 346/75 |
| 4,430,648 A | 2/1984 | Togashi et al. | 340/718 |
| 4,438,160 A | 3/1984 | Ishikawa et al. | 427/214 |
| 4,439,507 A | 3/1984 | Pan et al. | 340/59 |
| 4,444,961 A | 4/1984 | Timm | 526/88 |
| 4,450,440 A | 5/1984 | White | 340/753 |
| 4,500,880 A | 2/1985 | Gomersall et al. | 340/825.25 |
| 4,502,934 A | 3/1985 | Gazard et al. | 204/242 |
| 4,522,472 A | 6/1985 | Liebert et al. | 350/362 |
| 4,538,156 A | 8/1985 | Durkee et al. | 346/21 |
| 4,543,306 A | 9/1985 | Dubois et al. | 429/194 |
| 4,598,960 A | 7/1986 | DiSanto et al. | 339/17 |
| 4,605,284 A | 8/1986 | Fergason | 350/334 |
| 4,620,916 A | 11/1986 | Zwemer et al. | 204/299 |
| 4,623,706 A | 11/1986 | Timm et al. | 526/88 |
| 4,643,528 A | 2/1987 | Bell, Jr. | 350/334 |
| 4,648,956 A | 3/1987 | Marshall et al. | 204/299 |
| 4,655,897 A | 4/1987 | DiSanto et al. | 204/299 |
| 4,666,673 A | 5/1987 | Timm | 422/135 |
| 4,673,303 A | 6/1987 | Sansone et al. | 400/126 |
| 4,686,524 A | 8/1987 | White | 340/787 |
| 4,703,573 A | 11/1987 | Montgomery et al. | 40/455 |
| 4,707,080 A | 11/1987 | Fergason | 350/334 |
| 4,726,662 A | 2/1988 | Cromack | 350/345 |
| 4,730,186 A * | 3/1988 | Koga et al. | 345/182 |
| 4,732,830 A | 3/1988 | DiSanto et al. | 430/20 |
| 4,741,604 A | 5/1988 | Kornfeld | 350/362 |
| 4,742,345 A | 5/1988 | DiSanto et al. | 340/787 |
| 4,746,917 A | 5/1988 | DiSanto et al. | 340/787 |
| 4,748,366 A | 5/1988 | Taylor | 310/328 |
| 4,772,102 A | 9/1988 | Fergason et al. | 350/358 |
| 4,772,820 A | 9/1988 | DiSanto et al. | 313/505 |
| 4,794,390 A | 12/1988 | Lippman | 340/756 |
| 4,821,291 A | 4/1989 | Stevens et al. | 375/37 |
| 4,824,208 A | 4/1989 | Fergason et al. | 350/276 |
| 4,832,458 A | 5/1989 | Fergason et al. | |
| 4,833,464 A | 5/1989 | DiSanto et al. | 340/793 |
| 4,846,931 A | 7/1989 | Gmitter et al. | 156/633 |
| 4,850,919 A | 7/1989 | DiSanto et al. | 445/24 |
| 4,870,677 A | 9/1989 | DiSanto et al. | 379/96 |
| 4,883,561 A | 11/1989 | Gmitter et al. | 156/633 |
| 4,888,140 A | 12/1989 | Schlameus et al. | 264/4.3 |
| 4,889,603 A | 12/1989 | DiSanto et al. | 204/180.1 |
| 4,891,245 A | 1/1990 | Micale | 427/213.3 |
| 4,892,607 A | 1/1990 | DiSanto et al. | 156/275.7 |
| 4,909,959 A | 3/1990 | Lemaire et al. | 252/500 |
| 4,919,521 A | 4/1990 | Tada et al. | 350/362 |
| 4,931,019 A | 6/1990 | Park | 434/409 |
| 4,937,586 A | 6/1990 | Stevens et al. | 343/702 |
| 4,947,159 A | 8/1990 | DiSanto et al. | 340/787 |
| 4,947,219 A | 8/1990 | Boehm | 357/20 |
| 4,949,081 A | 8/1990 | Keller et al. | 340/765 |
| 4,960,351 A | 10/1990 | Kendall, Jr. et al. | 425/6 |
| 4,962,466 A | 10/1990 | Revesz et al. | 364/518 |
| 5,006,212 A | 4/1991 | DiSanto et al. | 204/192.14 |
| 5,009,490 A | 4/1991 | Kouno et al. | 350/342 |
| 5,016,002 A | 5/1991 | Levanto | 340/756 |
| 5,017,225 A | 5/1991 | Nakanishi et al. | 106/21 |
| 5,028,841 A | 7/1991 | DiSanto et al. | 313/505 |
| 5,040,960 A | 8/1991 | Shioya et al. | 425/5 |
| 5,041,824 A | 8/1991 | DiSanto et al. | 340/787 |
| 5,042,917 A | 8/1991 | Fujita et al. | 359/60 |
| 5,053,763 A | 10/1991 | DiSanto et al. | 340/787 |
| 5,057,363 A | 10/1991 | Nakanishi | 428/321.5 |
| 5,059,694 A | 10/1991 | Delabouglise et al. | 548/518 |
| 5,066,105 A | 11/1991 | Yoshimoto et al. | 359/58 |
| 5,066,559 A | 11/1991 | Elmasry et al. | 430/111 |
| 5,066,946 A | 11/1991 | DiSanto et al. | 340/787 |
| 5,070,326 A | 12/1991 | Yoshimoto et al. | 340/719 |
| 5,077,157 A | 12/1991 | DiSanto et al. | 430/20 |
| 5,082,351 A | 1/1992 | Fergason | 359/51 |
| 5,099,256 A | 3/1992 | Anderson | 346/1.1 |
| 5,105,185 A | 4/1992 | Nakanowatari et al. | 340/784 |
| 5,128,002 A | 7/1992 | Kuo et al. | 219/211 |
| 5,128,226 A | 7/1992 | Hung | 430/58 |
| 5,128,785 A | 7/1992 | Yoshimoto et al. | 359/58 |
| 5,132,049 A | 7/1992 | Garreau et al. | 252/500 |
| 5,138,472 A | 8/1992 | Jones et al. | 359/52 |
| 5,149,826 A | 9/1992 | Delabouglise et al. | 548/518 |
| 5,151,032 A | 9/1992 | Igawa | 434/409 |
| 5,161,007 A | 11/1992 | Takanashi et al. | 358/43 |
| 5,167,508 A | 12/1992 | Mc Taggart | 434/317 |
| 5,172,314 A | 12/1992 | Poland et al. | 364/401 |

| | | | |
|---|---|---|---|
| 5,174,882 A | 12/1992 | DiSanto et al. ............. 204/299 |
| 5,175,047 A | 12/1992 | McKenny et al. .......... 428/209 |
| 5,177,476 A | 1/1993 | DiSanto et al. ............. 340/787 |
| 5,185,226 A | 2/1993 | Grosso et al. ................ 430/47 |
| 5,187,609 A | 2/1993 | DiSanto et al. ............. 359/296 |
| 5,194,852 A | 3/1993 | More et al. .................. 340/712 |
| 5,204,424 A | 4/1993 | Roncali et al. .............. 526/256 |
| 5,216,416 A | 6/1993 | DiSanto et al. ............. 340/787 |
| 5,216,530 A | 6/1993 | Pearlman et al. ............. 359/43 |
| 5,220,316 A | 6/1993 | Kazan ........................ 340/784 |
| 5,223,115 A | 6/1993 | DiSanto et al. ............. 204/299 |
| 5,223,823 A | 6/1993 | DiSanto et al. ............. 340/787 |
| 5,233,459 A | 8/1993 | Bozler et al. ................ 359/230 |
| 5,236,484 A | 8/1993 | Nakashima et al. ........ 252/314 |
| 5,238,861 A | 8/1993 | Morin et al. .................. 437/51 |
| 5,247,290 A | 9/1993 | DiSanto et al. ............. 345/107 |
| 5,250,388 A | 10/1993 | Schoch, Jr. et al. ......... 430/269 |
| 5,250,932 A | 10/1993 | Yoshimoto et al. ......... 345/206 |
| 5,250,938 A | 10/1993 | DiSanto et al. ............. 345/107 |
| 5,254,981 A | 10/1993 | DiSanto et al. ............. 345/107 |
| 5,255,017 A | 10/1993 | Lam ....................... 346/140 R |
| 5,256,500 A | 10/1993 | Ishimoto ...................... 429/93 |
| 5,258,864 A | 11/1993 | Shannon ....................... 359/58 |
| 5,260,002 A | 11/1993 | Wang .......................... 264/4.1 |
| 5,262,098 A | 11/1993 | Crowley et al. ................. 264/8 |
| 5,266,098 A | 11/1993 | Chun et al. .................... 75/335 |
| 5,266,934 A | 11/1993 | Van Almen .................. 345/50 |
| 5,266,937 A | 11/1993 | DiSanto et al. ............. 345/107 |
| 5,268,448 A | 12/1993 | Buechner et al. ........... 528/380 |
| 5,270,843 A | 12/1993 | Wang .......................... 359/52 |
| 5,272,238 A | 12/1993 | Garnier et al. ................. 528/9 |
| 5,276,113 A | 1/1994 | Hashiguchi et al. .......... 526/65 |
| 5,276,438 A | 1/1994 | DiSanto et al. ............. 345/107 |
| 5,279,511 A | 1/1994 | DiSanto et al. ............... 445/24 |
| 5,279,694 A | 1/1994 | DiSanto et al. .......... 156/275.5 |
| 5,293,528 A | 3/1994 | DiSanto et al. ............. 345/107 |
| 5,296,974 A | 3/1994 | Tada et al. ................... 359/885 |
| 5,298,833 A | 3/1994 | Hou ........................... 313/483 |
| 5,302,235 A | 4/1994 | DiSanto et al. ............. 156/643 |
| 5,303,073 A | 4/1994 | Shirota et al. ................. 359/51 |
| 5,304,439 A | 4/1994 | DiSanto et al. ............... 430/20 |
| 5,315,312 A | 5/1994 | DiSanto et al. ............. 345/107 |
| 5,316,341 A | 5/1994 | Schwartz ................... 281/15.1 |
| 5,344,594 A | 9/1994 | Sheridon ..................... 264/4.1 |
| 5,345,231 A | 9/1994 | Koo et al. ............. 340/870.31 |
| 5,345,251 A | 9/1994 | DiSanto et al. ............. 345/107 |
| 5,347,144 A | 9/1994 | Garnier et al. ................ 257/40 |
| 5,357,355 A | 10/1994 | Arai ............................. 359/39 |
| 5,359,346 A | 10/1994 | DiSanto et al. ............. 345/107 |
| 5,360,689 A | 11/1994 | Hou et al. ..................... 430/34 |
| 5,362,671 A | 11/1994 | Zavracky et al. ............. 437/81 |
| 5,372,852 A | 12/1994 | Titterington et al. ........ 427/288 |
| 5,374,815 A | 12/1994 | Waterhouse et al. ........ 235/383 |
| 5,380,362 A | 1/1995 | Schubert .................... 106/493 |
| 5,383,008 A | 1/1995 | Sheridon .................... 355/256 |
| 5,389,945 A | 2/1995 | Sheridon ...................... 345/85 |
| 5,389,958 A | 2/1995 | Bui et al. .................... 347/103 |
| 5,398,131 A | 3/1995 | Hall et al. ................... 359/465 |
| 5,402,145 A | 3/1995 | DiSanto et al. ............. 345/107 |
| 5,403,518 A | 4/1995 | Schubert .................... 252/572 |
| 5,403,772 A | 4/1995 | Zhang et al. ................ 437/101 |
| 5,411,398 A | 5/1995 | Nakanishi et al. .......... 434/409 |
| 5,411,656 A | 5/1995 | Schubert .................... 204/299 |
| 5,412,398 A | 5/1995 | DiSanto et al. ............. 345/107 |
| 5,421,926 A | 6/1995 | Yukinobu et al. ............. 156/83 |
| 5,450,069 A | 9/1995 | DiSanto et al. ........ 340/825.31 |
| 5,459,776 A | 10/1995 | DiSanto et al. ............... 379/96 |
| 5,460,688 A | 10/1995 | DiSanto et al. ................ 216/5 |
| 5,463,492 A | 10/1995 | Check, III .................. 359/296 |
| 5,467,107 A | 11/1995 | DiSanto et al. ............. 345/107 |
| 5,471,233 A | 11/1995 | Okamoto et al. ........... 347/103 |
| 5,484,292 A | 1/1996 | McTaggart .................. 434/317 |
| 5,485,176 A | 1/1996 | Ohara et al. ................. 345/173 |
| 5,497,171 A | 3/1996 | Teres et al. .................... 345/43 |
| 5,498,674 A | 3/1996 | Hou et al. ................... 525/369 |
| 5,499,038 A | 3/1996 | DiSanto et al. ............. 345/107 |
| 5,500,635 A | 3/1996 | Mott ..................... 340/323 R |
| 5,502,476 A | 3/1996 | Neal et al. ................... 347/103 |
| 5,508,068 A | 4/1996 | Nakano ......................... 428/1 |
| 5,508,720 A | 4/1996 | DiSanto et al. ............. 345/169 |
| 5,512,162 A | 4/1996 | Sachs et al. ................... 205/91 |
| 5,517,407 A | 5/1996 | Weiner .................. 364/419.01 |
| 5,528,399 A | 6/1996 | Izumi et al. ................... 359/72 |
| 5,534,888 A | 7/1996 | Lebby et al. ................ 345/121 |
| 5,538,430 A | 7/1996 | Smith et al. ................. 434/178 |
| 5,543,177 A | 8/1996 | Morrison et al. ........... 427/288 |
| 5,543,219 A | 8/1996 | Elwakil ................. 428/402.24 |
| 5,545,291 A | 8/1996 | Smith et al. ............. 156/655.1 |
| 5,548,282 A | 8/1996 | Escritt et al. .......... 340/825.35 |
| 5,552,679 A | 9/1996 | Murasko ................... 315/169.3 |
| 5,556,583 A | 9/1996 | Tashiro et al. ............... 264/4.1 |
| 5,561,443 A | 10/1996 | DiSanto et al. ............. 345/107 |
| 5,565,885 A | 10/1996 | Tamanoi ..................... 345/100 |
| 5,569,610 A | 10/1996 | Zhang et al. .................. 437/21 |
| 5,571,268 A | 11/1996 | Azibert ........................ 277/39 |
| 5,573,711 A | 11/1996 | Hou et al. ................... 252/572 |
| 5,575,554 A | 11/1996 | Guritz ........................ 362/103 |
| 5,582,700 A | 12/1996 | Bryning et al. ............. 204/450 |
| 5,583,675 A | 12/1996 | Yamada et al. ............... 349/84 |
| 5,596,208 A | 1/1997 | Dodabalapur et al. ......... 257/66 |
| 5,597,889 A | 1/1997 | Takimoto et al. ........... 528/353 |
| 5,602,572 A | 2/1997 | Rylander ...................... 347/15 |
| 5,604,027 A | 2/1997 | Sheridon .................... 428/323 |
| 5,604,070 A | 2/1997 | Rao et al. .................... 430/110 |
| 5,609,978 A | 3/1997 | Giorgianni et al. ........... 430/30 |
| 5,610,455 A | 3/1997 | Allen et al. ................. 307/400 |
| 5,614,340 A | 3/1997 | Bugner et al. ................ 340/41 |
| 5,619,307 A | 4/1997 | Machino et al. .............. 399/11 |
| 5,623,585 A | 4/1997 | Matias et al. ............... 395/115 |
| 5,625,199 A | 4/1997 | Baumbach et al. ........... 257/40 |
| 5,625,460 A | 4/1997 | Tai ............................. 358/298 |
| 5,627,561 A | 5/1997 | Laspina et al. ............. 345/107 |
| 5,635,317 A | 6/1997 | Taniguchi et al. .............. 430/7 |
| 5,638,103 A | 6/1997 | Obata et al. ................. 347/164 |
| 5,639,914 A | 6/1997 | Tomiyama et al. ......... 564/309 |
| 5,641,974 A | 6/1997 | den Boer et al. .............. 257/59 |
| 5,643,506 A | 7/1997 | Rourke ....................... 264/4.1 |
| 5,643,673 A | 7/1997 | Hou ...................... 428/402.24 |
| 5,648,801 A | 7/1997 | Beardsley et al. ............ 347/15 |
| 5,649,266 A | 7/1997 | Rushing ....................... 399/59 |
| 5,650,199 A | 7/1997 | Chang et al. .................. 427/33 |
| 5,650,247 A | 7/1997 | Taniguchi et al. .............. 430/1 |
| 5,650,872 A | 7/1997 | Saxe et al. ................... 359/296 |
| 5,654,367 A | 8/1997 | Takimoto et al. ........... 525/178 |
| 5,659,181 A | 8/1997 | Bridenbaugh et al. ........ 257/40 |
| 5,663,224 A | 9/1997 | Emmons et al. ............. 524/188 |
| 5,672,381 A | 9/1997 | Rajan ......................... 427/198 |
| 5,673,148 A | 9/1997 | Morris et al. ............... 359/536 |
| 5,675,719 A | 10/1997 | Matias et al. ............... 395/115 |
| 5,676,884 A | 10/1997 | Tiers et al. .................. 252/582 |
| 5,684,501 A | 11/1997 | Knapp et al. .................. 345/94 |
| 5,686,383 A | 11/1997 | Long et al. .................. 503/227 |
| 5,688,584 A | 11/1997 | Casson et al. ............... 428/209 |
| 5,689,282 A | 11/1997 | Wolfs et al. ................. 345/100 |
| 5,691,098 A | 11/1997 | Busman et al. ............. 430/158 |
| 5,693,442 A | 12/1997 | Weiss et al. ................... 430/66 |
| 5,693,977 A | 12/1997 | Haddon et al. .............. 257/431 |
| 5,694,224 A | 12/1997 | Tai ............................. 358/455 |
| 5,699,097 A | 12/1997 | Takayama et al. .......... 347/171 |
| 5,699,102 A | 12/1997 | Ng et al. ..................... 347/224 |
| 5,705,826 A | 1/1998 | Arataini et al. ............... 257/40 |
| 5,707,081 A | 1/1998 | Luna ........................... 283/45 |

| Patent | Date | Inventor | Class |
|---|---|---|---|
| 5,707,738 A | 1/1998 | Hou | 428/402 |
| 5,707,747 A | 1/1998 | Tomiyama et al. | 428/457 |
| 5,708,525 A | 1/1998 | Sheridon | 359/296 |
| 5,709,976 A | 1/1998 | Malhotra | 430/124 |
| 5,714,051 A | 2/1998 | Van Leth et al. | 205/122 |
| 5,714,270 A | 2/1998 | Malhotra et al. | 428/537.5 |
| 5,715,511 A | 2/1998 | Aslam et al. | 399/320 |
| 5,715,514 A | 2/1998 | Williams et al. | 399/395 |
| 5,716,550 A | 2/1998 | Gardner et al. | 252/500 |
| 5,717,168 A * | 2/1998 | DeBuisset et al. | 345/158 |
| 5,717,283 A | 2/1998 | Biegelsen et al. | 313/483 |
| 5,717,514 A | 2/1998 | Sheridon | 359/296 |
| 5,717,515 A | 2/1998 | Sheridon | 359/296 |
| 5,718,996 A | 2/1998 | Iijima et al. | 430/56 |
| 5,721,042 A | 2/1998 | Iijima et al. | 428/195 |
| 5,722,781 A | 3/1998 | Yamaguchi | 400/61 |
| 5,725,935 A | 3/1998 | Rajan | 428/195 |
| 5,729,632 A | 3/1998 | Tai | 382/237 |
| 5,729,663 A | 3/1998 | Lin et al. | 395/109 |
| 5,731,116 A | 3/1998 | Matsuo et al. | 430/56 |
| 5,737,115 A | 4/1998 | Mackinlay et al. | 359/296 |
| 5,738,174 A | 4/1998 | Gingerich | 172/274 |
| 5,738,716 A | 4/1998 | Santilli et al. | 106/31.77 |
| 5,738,977 A | 4/1998 | Van Der Sluis-Van Der Voot et al. | 430/313 |
| 5,739,801 A | 4/1998 | Sheridon | 345/84 |
| 5,740,495 A | 4/1998 | Maher et al. | 399/71 |
| 5,742,879 A | 4/1998 | Altrieth, III | 399/139 |
| 5,744,283 A | 4/1998 | Spierings et al. | 430/313 |
| 5,745,094 A | 4/1998 | Gordon, II et al. | 345/107 |
| 5,750,238 A | 5/1998 | Iijima et al. | 428/195 |
| 5,751,257 A | 5/1998 | Sutherland | 345/2 |
| 5,751,268 A | 5/1998 | Sheridon | 345/107 |
| 5,751,433 A | 5/1998 | Narendranath et al. | 358/298 |
| 5,751,434 A | 5/1998 | Narendranath et al. | 358/298 |
| 5,752,152 A | 5/1998 | Gasper et al. | 399/366 |
| 5,753,763 A | 5/1998 | Rao et al. | 525/276 |
| 5,754,332 A | 5/1998 | Crowley | 359/296 |
| 5,759,671 A | 6/1998 | Tanaka et al. | 428/166 |
| 5,760,761 A | 6/1998 | Sheridon | 345/107 |
| 5,767,826 A | 6/1998 | Sheridon et al. | 345/84 |
| 5,767,978 A | 6/1998 | Revankar et al. | 358/296 |
| 5,777,782 A | 7/1998 | Sheridon | 359/296 |
| 5,783,614 A | 7/1998 | Chen et al. | 523/205 |
| 5,783,856 A | 7/1998 | Smith et al. | 257/618 |
| 5,786,875 A | 7/1998 | Brader et al. | 349/20 |
| 5,801,664 A | 9/1998 | Seidensticker et al. | 345/2 |
| 5,808,783 A | 9/1998 | Crowley | 359/296 |
| 5,821,137 A | 10/1998 | Wakai et al. | 438/163 |
| 5,824,186 A | 10/1998 | Smith et al. | 156/655.1 |
| 5,825,529 A | 10/1998 | Crowley | 359/296 |
| 5,828,432 A | 10/1998 | Shashidhar et al. | 349/139 |
| 5,835,577 A | 11/1998 | DiSanto et al. | 379/93.19 |
| 5,843,259 A | 12/1998 | Narang et al. | 156/151 |
| 5,872,552 A | 2/1999 | Gordon, II et al. | 345/107 |
| 5,892,244 A | 4/1999 | Tanaka et al. | 257/40 |
| 5,894,367 A | 4/1999 | Sheridon | 359/623 |
| 5,900,858 A | 5/1999 | Richley | 345/107 |
| 5,904,545 A | 5/1999 | Smith et al. | 438/455 |
| 5,914,806 A | 6/1999 | Gordon, II et al. | 359/296 |
| 5,930,026 A * | 7/1999 | Jacobson et al. | |
| 5,936,259 A | 8/1999 | Katz et al. | 257/40 |
| 5,961,804 A | 10/1999 | Jacobson et al. | 204/606 |
| 5,963,456 A | 10/1999 | Klein et al. | 364/496 |
| 5,969,376 A | 10/1999 | Bao | 257/40 |
| 5,978,052 A | 11/1999 | Ileisin et al. | 348/797 |
| 5,982,504 A | 11/1999 | Knapp | 345/204 |
| 6,005,791 A | 12/1999 | Gudesen et al. | 365/114 |
| 6,005,817 A | 12/1999 | Gudesen et al. | 365/215 |
| 6,014,247 A | 1/2000 | Winter et al. | 359/296 |
| 6,017,584 A | 1/2000 | Albert et al. | 427/213.3 |
| 6,025,896 A | 2/2000 | Hattori et al. | 349/86 |
| 6,031,594 A | 2/2000 | Engle | 349/158 |
| 6,045,955 A | 4/2000 | Vincent | 430/45 |
| 6,055,180 A | 4/2000 | Gudesen et al. | 365/175 |
| 6,064,784 A | 5/2000 | Whitehead et al. | 385/18 |
| 6,067,185 A | 5/2000 | Albert et al. | 359/296 |
| 6,067,094 A | 6/2000 | Cohen et al. | 707/104 |
| 6,105,290 A * | 8/2000 | Coates et al. | |
| 6,107,117 A | 8/2000 | Bao et al. | 438/99 |
| 6,113,810 A | 9/2000 | Hou et al. | 252/572 |
| 6,117,294 A | 9/2000 | Rasmussen | 204/485 |
| 6,117,368 A | 9/2000 | Hou | 252/572 |
| 6,118,426 A | 9/2000 | Albert et al. | 345/107 |
| 6,136,702 A | 10/2000 | Chandross et al. | 438/678 |
| 6,137,467 A * | 10/2000 | Sheridon et al. | 345/173 |
| 6,114,361 A | 11/2000 | Gordon, II et al. | 345/107 |
| 6,146,716 A | 11/2000 | Narang | 427/559 |
| 6,150,191 A | 11/2000 | Bao | 438/99 |
| 6,150,668 A | 11/2000 | Bao et al. | 257/40 |
| 6,153,075 A | 11/2000 | Nemelka | 204/485 |
| 6,171,464 B1 | 1/2001 | Chadha | 204/490 |
| 6,184,856 B1 | 2/2001 | Gordon, II et al. | 345/107 |
| 6,198,809 B1 | 3/2001 | DiSanto et al. | 379/93.23 |
| 6,215,130 B1 | 4/2001 | Dodabalapur | 257/67 |
| 6,215,160 B1 | 4/2001 | Nordal et al. | 359/107 |
| 6,215,920 B1 | 4/2001 | Whitehead et al. | 385/18 |
| 6,225,971 B1 | 5/2001 | Gordon, II et al. | 345/107 |
| 6,239,896 B1 | 5/2001 | Ikeda | 359/240 |
| 6,262,706 B1 | 7/2001 | Albert et al. | 345/107 |
| 6,262,833 B1 | 7/2001 | Loxley et al. | 359/296 |
| 6,271,823 B1 | 8/2001 | Gordon, II et al. | 345/107 |
| 6,323,989 B1 | 11/2001 | Jacobson et al. | 359/296 |

FOREIGN PATENT DOCUMENTS

| | | |
|---|---|---|
| EP | 0186710 A1 | 5/1988 |
| EP | 0344367 B1 | 5/1988 |
| EP | 0 268 877 | 6/1988 |
| EP | 0 281 204 | 9/1988 |
| EP | 0448853 A1 | 3/1989 |
| EP | 0362928 A1 | 9/1989 |
| EP | 0363030 A2 | 9/1989 |
| EP | 0363030 B1 | 9/1989 |
| EP | 0417362 A1 | 9/1989 |
| EP | 0417362 B1 | 9/1989 |
| EP | 0369878 B1 | 11/1989 |
| EP | 0390303 A2 | 3/1990 |
| EP | 0396247 A2 | 3/1990 |
| EP | 0396247 B1 | 3/1990 |
| EP | 0448853 B1 | 3/1990 |
| EP | 0570995 B1 | 3/1990 |
| EP | 0570995 A1 | 3/1990 |
| EP | 0 361 420 | 4/1990 |
| EP | 0402269 A1 | 6/1990 |
| EP | 0 396 937 | 11/1990 |
| EP | 0 404 545 | 12/1990 |
| EP | 0460747 A2 | 5/1991 |
| EP | 0586373 B1 | 5/1991 |
| EP | 0537240 B1 | 7/1991 |
| EP | 0595812 B1 | 7/1991 |
| EP | 0 442 123 | 8/1991 |
| EP | 0 443 571 | 8/1991 |
| EP | 0600878 B1 | 8/1991 |
| EP | 0604423 B1 | 9/1991 |
| EP | 0 240 063 | 1/1992 |
| EP | 0575475 B1 | 2/1992 |
| EP | 0586545 B1 | 5/1992 |
| EP | 0601072 B1 | 8/1992 |
| EP | 0601075 B1 | 8/1992 |
| EP | 0618715 A1 | 12/1992 |
| EP | 0 323 656 | 4/1993 |
| EP | 0 540 281 | 5/1993 |

| | | | | | | |
|---|---|---|---|---|---|---|
| EP | 0 555 982 | 8/1993 | | JP | 3053224 | 3/1991 |
| EP | 0685101 B1 | 1/1994 | | JP | 3091722 | 4/1991 |
| EP | 0 585 000 | 3/1994 | | JP | 03091722 A | 4/1991 |
| EP | 0 325 013 | 5/1994 | | JP | 3096925 | 4/1991 |
| EP | 0708798 B1 | 6/1994 | | JP | 03096925 A | 4/1991 |
| EP | 0 375 005 | 9/1994 | | JP | 3105882 | 5/1991 |
| EP | 0 408 105 | 1/1995 | | JP | 3118196 | 5/1991 |
| EP | 0684579 A2 | 4/1995 | | JP | 9211499 | 8/1991 |
| EP | 0709713 A2 | 10/1995 | | JP | 04345133 A | 12/1991 |
| EP | 0717446 A2 | 12/1995 | | JP | 04199638 | 7/1992 |
| EP | 0717446 A3 | 12/1995 | | JP | 04307512 A | 10/1992 |
| EP | 0 525 852 | 5/1996 | | JP | 4307523 | 10/1992 |
| EP | 0 721 176 | 11/1996 | | JP | 4355786 | 12/1992 |
| EP | 0778083 A1 | 12/1996 | | JP | 5-61421 | 3/1993 |
| EP | 0802217 A2 | 4/1997 | | JP | 05165064 | 6/1993 |
| EP | 0889425 A1 | 6/1997 | | JP | 05173194 | 7/1993 |
| EP | 0825657 A2 | 8/1997 | | JP | 05307197 | 11/1993 |
| EP | 0852403 A1 | 12/1997 | | JP | 93085609 | 12/1993 |
| EP | 0863557 A2 | 3/1998 | | JP | 06-089081 | 3/1994 |
| EP | 0930641 A2 | 1/1999 | | JP | 6089081 | 3/1994 |
| EP | 0 899 651 | 3/1999 | | JP | 6-202168 | 7/1994 |
| EP | 0962808 A2 | 5/1999 | | JP | 07036020 | 2/1995 |
| EP | 0962984 A2 | 5/1999 | | JP | 2551783 | 8/1996 |
| EP | 0 924 551 | 6/1999 | | JP | 08234176 | 9/1996 |
| EP | 0981165 A1 | 8/1999 | | JP | 9-6277 | 1/1997 |
| EP | 1000741 A2 | 10/1999 | | JP | 09016116 | 1/1997 |
| EP | 1024540 A2 | 1/2000 | | JP | 9031453 A | 2/1997 |
| EP | 1089118 A2 | 9/2000 | | JP | 9031433 | 4/1997 |
| EP | 1102335 A2 | 11/2000 | | JP | 9-185087 | 7/1997 |
| EP | 1104035 A2 | 11/2000 | | JP | 09230391 | 9/1997 |
| FR | 2693005 | 6/1992 | | JP | 10-48673 | 2/1998 |
| GB | 1 465 701 | 3/1977 | | JP | 10072571 A | 3/1998 |
| GB | 2 044 508 | 10/1980 | | JP | 10135481 | 5/1998 |
| GB | 2094044 A | 3/1982 | | JP | 10142628 | 5/1998 |
| GB | 2149548 A | 10/1984 | | JP | 10-149118 | 6/1998 |
| GB | 2255934 A | 3/1992 | | JP | 10-161161 | 6/1998 |
| GB | 2292119 A | 8/1995 | | JP | 10190001 | 7/1998 |
| GB | 2324273 A | 8/1995 | | JP | 11073004 | 1/1999 |
| GB | 2 306 229 | 4/1997 | | JP | 11073083 | 3/1999 |
| GB | 2330451 A | 10/1997 | | JP | 11084953 | 3/1999 |
| JP | 1 314 906 | 4/1973 | | JP | 00321605 | 5/1999 |
| JP | 53-73098 | 6/1978 | | JP | 00322002 | 5/1999 |
| JP | 54111368 | 8/1979 | | JP | 00322003 | 5/1999 |
| JP | 55096922 | 7/1980 | | JP | 00322004 | 5/1999 |
| JP | 59098227 | 6/1984 | | JP | 00322005 | 5/1999 |
| JP | 60189731 | 9/1985 | | JP | 00322006 | 5/1999 |
| JP | 60197565 | 10/1985 | | JP | 00322007 | 5/1999 |
| JP | 61074292 | 4/1986 | | JP | 11143201 | 5/1999 |
| JP | 62058222 | 3/1987 | | JP | 11153929 | 6/1999 |
| JP | 62231930 | 10/1987 | | JP | 11161115 | 6/1999 |
| JP | 62269124 | 11/1987 | | JP | 11195790 | 7/1999 |
| JP | 62299824 | 12/1987 | | JP | 11202804 | 7/1999 |
| JP | 63006632 | 1/1988 | | JP | 11212499 | 8/1999 |
| JP | 01086118 A | 6/1988 | | JP | 11219135 | 8/1999 |
| JP | 01086116 | 3/1989 | | JP | 11237851 | 8/1999 |
| JP | 01086117 | 3/1989 | | JP | 11264812 | 9/1999 |
| JP | 64-86116 | 3/1989 | | JP | 11352526 | 12/1999 |
| JP | 188986 | 4/1989 | | JP | 00029403 | 1/2000 |
| JP | 01125613 | 5/1989 | | JP | 00066247 | 1/2000 |
| JP | 01142537 | 6/1989 | | JP | 00066248 | 1/2000 |
| JP | 01-177517 | 7/1989 | | JP | 00066249 | 1/2000 |
| JP | 01177517 | 7/1989 | | JP | 00089260 | 1/2000 |
| JP | 01248182 | 10/1989 | | JP | 00127478 | 1/2000 |
| JP | 01267525 | 10/1989 | | JP | 00137250 | 1/2000 |
| JP | WO90/08402 | 7/1990 | | JP | 00140582 | 1/2000 |
| JP | 02223934 | 9/1990 | | JP | 00162650 | 1/2000 |
| JP | 02223935 | 9/1990 | | JP | 00171839 | 1/2000 |
| JP | 02223936 | 9/1990 | | JP | 00194021 | 1/2000 |
| JP | 02284124 | 11/1990 | | JP | 00206574 | 1/2000 |
| JP | 02284125 | 11/1990 | | JP | 00221546 | 1/2000 |
| JP | 03053114 A | 3/1991 | | JP | 00227612 | 1/2000 |

| | | |
|---|---|---|
| JP | 00231307 | 1/2000 |
| JP | 00258805 | 1/2000 |
| JP | 00259102 | 1/2000 |
| JP | 00285219 | 1/2000 |
| JP | 00315253 | 1/2000 |
| JP | 00322001 | 3/2000 |
| JP | 01005040 | 1/2001 |
| JP | 01020093 | 1/2001 |
| JP | 06239896 | 5/2001 |
| WO | WO82/02961 | 9/1982 |
| WO | WO92/09061 | 5/1992 |
| WO | WO92/12453 | 7/1992 |
| WO | WO92/17873 | 10/1992 |
| WO | WO92/20060 | 11/1992 |
| WO | WO92/21733 | 12/1992 |
| WO | WO93/02443 | 2/1993 |
| WO | WO93/04458 | 3/1993 |
| WO | WO93/04459 | 3/1993 |
| WO | WO93/05425 | 3/1993 |
| WO | WO93/07000 | 4/1993 |
| WO | WO93/07608 | 4/1993 |
| WO | WO93/17414 | 9/1993 |
| WO | WO93/18428 | 9/1993 |
| WO | WO94/19789 | 9/1994 |
| WO | WO94/24236 | 10/1994 |
| WO | WO95/02636 | 1/1995 |
| WO | WO95/05622 | 2/1995 |
| WO | WO95/06307 | 3/1995 |
| WO | WO95/07527 | 3/1995 |
| WO | WO95/10107 | 4/1995 |
| WO | WO95/15363 | 6/1995 |
| WO | WO95/19227 | 7/1995 |
| WO | WO95/22085 | 8/1995 |
| WO | WO95/27924 | 10/1995 |
| WO | WO95/33085 | 12/1995 |
| WO | WO96/17102 | 6/1996 |
| WO | WO96/41372 | 12/1996 |
| WO | WO97/01165 | 1/1997 |
| WO | WO97/01166 | 1/1997 |
| WO | WO97/01171 | 1/1997 |
| WO | WO97/04398 | 2/1997 |
| WO | WO97/04448 | 2/1997 |
| WO | WO97/20274 | 6/1997 |
| WO | WO97/24715 | 7/1997 |
| WO | WO97/24907 | 7/1997 |
| WO | WO97/33275 | 9/1997 |
| WO | WO97/35298 | 9/1997 |
| WO | WO97/48009 | 12/1997 |
| WO | WO97/49125 | 12/1997 |
| WO | WO98/03896 | 1/1998 |
| WO | WO98/12585 | 3/1998 |
| WO | WO98/19208 | 5/1998 |
| WO | WO98/41898 | 9/1998 |
| WO | WO98/41899 | 9/1998 |
| WO | WO98/55897 | 12/1998 |
| WO | WO98/58383 | 12/1998 |
| WO | WO99/03087 | 1/1999 |
| WO | WO99/03626 | 1/1999 |
| WO | WO99/10767 | 3/1999 |
| WO | WO99/12170 | 3/1999 |
| WO | WO99/14762 | 3/1999 |
| WO | WO99/14763 | 3/1999 |
| WO | WO99/10768 | 4/1999 |
| WO | WO99/10769 | 4/1999 |
| WO | WO99/10939 | 4/1999 |
| WO | WO99/20682 | 4/1999 |
| WO | WO99/26419 | 5/1999 |
| WO | WO99/40631 | 8/1999 |
| WO | WO99/41728 | 8/1999 |
| WO | WO99/41732 | 8/1999 |
| WO | WO99/41787 | 8/1999 |
| WO | WO99/41788 | 8/1999 |
| WO | WO99/42983 | 8/1999 |
| WO | WO99/44229 | 9/1999 |
| WO | WO99/45416 | 9/1999 |
| WO | WO99/45582 | 9/1999 |
| WO | WO99/47970 | 9/1999 |
| WO | WO99/53371 | 10/1999 |
| WO | WO99/53373 | 10/1999 |
| WO | WO99/56171 | 11/1999 |
| WO | WO99/63527 | 12/1999 |
| WO | WO99/65011 | 12/1999 |
| WO | WO99/65012 | 12/1999 |
| WO | WO99/66540 | 12/1999 |
| WO | WO99/66551 | 12/1999 |
| WO | WO00/10048 | 2/2000 |
| WO | WO00/16189 | 3/2000 |
| WO | WO00/49593 | 8/2000 |
| WO | WO00/54101 | 9/2000 |
| WO | WO00/65653 | 11/2000 |
| WO | WO00/75720 | 12/2000 |
| WO | WO00/77570 | 12/2000 |
| WO | WO00/77571 | 12/2000 |
| WO | WO01/11424 | 2/2001 |
| WO | WO01/18090 A1 | 3/2001 |
| WO | WO01/40856 A1 | 6/2001 |
| WO | WO01/65309 A1 | 9/2001 |
| WO | WO01/67170 A1 | 9/2001 |

OTHER PUBLICATIONS

Beilin, et al. "2000–Character Electrophoretic Display." SID 86 Digest: 136–139 (1986).

Bohnke, et al. "Polymer–Based Solid Electrochromic Cell for Matrix–Addressable Display Devices." Journal of the Electrochemical Society 138 (12): 3612–3617 (Dec., 1991).

Kenward, "Displaying a Winning Glow." Technology Review: 69–73 (Jan./Feb., 1999).

Chiang, "Conduction Mechanism of Charge Control Agents Used in Electrophoretic Display Devices." Proceeding of the SID 18 (3 & 4): 275–282 (Third and Fourth Quarters, 1977).

"Field–Effect Transistor With Diphthalocyanine Thin Film." Electronics Letters 24 (11): 674–675 (May 26, 1988).

Chiang, et al., "A High Speed Electrophoretic Matrix Display." SID 80 Digest:114–115 (1980).

Croucher, et al., "Electrophoretic Display: Materials as Related to Performance." Photographic Science and Engineering 25 (2): 80–86 (Mar./Apr., 1981).

Dalisa, "Electrophoretic Display Technology." IEEE Transactions on Electron Devices ED–24 (7): 827–834 (Jul., 1977).

Egashira, et al. "A Solid Electrochromic Cell Consisting of Lu–Diphthalocyanine and Lead Fluoride." Proceedings of the SID 28 (3): 227–232 (1987).

Fitzhenry, "Optical Effects of Adsorption of Dyes on Pigment Used in Electrophoretic Image Displays." Applied Optics 18 (19): 3332–3337 (Oct. 1, 1979).

Fitzhenry, "Optical Properties of Electrophoretic Image Display." Proceedings of the SID 22 (4): 300–309 (1981).

Goodman, "Passive Liquid Displays: Liquid Crystals, Electrophoretics, and Electrochromics." Proceeding of the SID 17 (1): 30–38 (First Quarter, 1976).

Bachmann, et al., "Additional Uses for Encapsulated Products." 278–343.

Hatano, et al., "Bistable Paper–White Display Device Using Cholesteric Liquid Crystals." SID 96 Digest: 269–272 (1996).

Hosaka, et al., "Electromagnetic Microrelays: Concepts and Fundamental Characteristics." Sensors and Actuators A40 (1): 41–47 (Jan., 1994).

Jin, et al., "Optically Transparent, Electrically Conductive Composite Medium." Science 255 (5043): 446–448 (Jan. 24, 1992).

Kornfeld, "A Defect–Tolerant Active–Matrix Electrophoretic Display." SID 84 Digest: 142–144 (1984).

Lewis, et al., "Gravitational, Inter–Particle and Particle–Electrode Forces in the Electrophoretic Display." Proceeding of the SID 18 (3 & 4): 235–242 (Third and Fourth Quarters, 1977).

Moesner, et al., "Devices for Particle Handling by an AC Electric Field." IEEE: 66–71 (1995).

Murau, et al., "The Understanding and Elimination of Some Suspension Instabilities in an Electrophoretic Display." Journal of Applied Physics 49 (9): 4820–4829 (Sep., 1978).

Vaz, et al., "Dual Frequency Addressing of Polymer–Dispersed Liquid–Crystal Films." Journal of Applied Physics 65 (12): 5043–5050 (Jun. 15, 1989).

Ota, et al., "Developments in Electrophoretic Displays." Proceeding of the SID 18 (3 & 4): 243–254 (Third and Fourth Quarters, 1977).

Ota, et al., "Electrophoretic Display Devices." Laser 75 Optoelectronics Conference Proceedings: 145–148.

Ota, et al., "Electrophoretic Image Display (EPID) Panel." Proceedings of the IEEE: 1–5 (1973).

Ziemelis, "Putting it on Plastic." Nature 393: 619–620 (Jun. 18, 1998).

Pearlstein, "Electroless Plating." Modern Electroplating: 710–747.

Quon, "Multilevel Voltage Select (MLVS): A Novel Technique to X–Y Address an Electrophoretic Image Display." Correspondence: 1120–1123.

"E Ink Debuts in JC Penney Stores." Boston Herald: 27 (May 3, 1999).

Sheridon, et al., "A Photoconductor–Addressed Electrophoretic Cell for Office Data Display." SID 82 Digest: 94–95 (1982).

Shiwa, et al., "Electrophoretic Display Method Using Ionographic Technology." SID 88 Digest: 61–62 (1988).

Singer, et al., "An X–Y Addressable Electrophoretic Display." Proceeding of the SID 18 (3 & 4): 255–266 (Third and Fourth Quarters, 1977).

Dobson, "Electronic Book is a Whole Library." The Sunday Times (Feb. 25, 1996).

Vance, "Optical Characteristics of Electrophoretic Displays." Proceeding of the SID 18 (3 & 4): 267–274 (Third and Fourth Quarters, 1977).

Vizard, "Electric Tales: Computer Chips Replace Wood Chips in the Page of 21$^{st}$ Century Book." Times Mirror Magazines, Inc., Reprinted from Popular Science Magazine, (1997).

Yang, et al., "A New Architecture for Polymer Transistors." Nature 372: 344–346 (Nov. 24, 1994).

Zollinger, "Structure of SImple Di– and Triarylmethine Dyes." In Color Chemistry: Synthesis, Properties and Applications of Organic Dyes and Pigments. 2d ed. V.C.H. Weinham, 73 (1991).

Wilmsen, "'Electronic Ink' Sign Debuts at JC Penney." The Boston Globe (Tuesday, May 4, 1999).

Flaherty, "What Did Disappearing Ink Grow Up to Be? Electronic Ink." The New York Times (Thursday, May 6, 1999).

Jacobson, et al., "Surfaces and Displays." Wired (Jan. 1997).

Comiskey, et al., "An Electrophoretic Ink for All–Printed Reflective Electronic Displays." Nature 394: 253–255 (Jul. 1998).

Zurer, "Digital Ink Brings Electronic Books Closer." C&EN (Jul. 20, 1998).

Peterson, "Rethinking Ink." Science News 153: 396–397 (Jun. 20, 1998).

Guernsey, "Beyond Neon: Electronic Ink." The New York Times (Thursday, Jun. 3, 1999).

White, "An Electrophoretic Bar Graph Display." Proceedings of the SID 22 (3): 173–180 (1981).

Pansu, et al., "Structures of Thin Layers of Hard Spheres: High Pressure Limit." J. Physique 45: 331–339 (1984).

Pieranski, et al., "Thin Colloidal Crystals." Physical Review Letters 50 (12): 900–903 (Mar. 21, 1983).

Van Winkle, et al., "Layering Transitions in Colloidal Crystals as Observed by Diffraction and Direct–Lattice Imaging." Physical Review 34 (1): 562–573 (Jul. 1986).

Chiang et al., "A Stylus Writable Electrophoretic Display Device." SID International Symposium: 44–45, XP–02102514, (May 8–10, 1979).

International Search Report, International Application No. PCT/US99/10543.

Gutcho, "Capsule Wall Treatment", Microcapsules and Microencapsulation Techniques, 1976, pp. 156–177.

Gutcho, "Microencapsulation with Synthetic Polymeric Film Formers", Microcapsules and Microencapsulation Techniques, 1976, pp. 65–130.

Gutcho, "Pigments and Paints", Microcapsules and Microencapsulation Techniques, 1976, pp. 178–193.

Platt, C., "Digital Ink", Wired, May 1997, 5 pages.

Ackerman, J., "E Ink of Cambridge Gets Start–Up Funding", Boston Globe, Dec. 27, 1997, p. D4.

Comiskey et al, "Electrophoretic Ink: A Printable Display Material", SID 97 Digest, 1997, pp. 75–76.

Howe, P. J., "MIT Book Would Bind Computer 'Ink' to Paper," Boston Globe, Mar. 17, 1996, pp. 31,35.

Lee, L., "Fabrication of Magnetic Particles Display," Proceeding of the S.I.D., 1977, vol. 18, Nos. 3 & 4, pp. 283–288.

Pankove, J., "Color Reflection Type Display Panel", RCA Technical Notes, 1962, No. 535: 2 pages.

Saitoh, M. et al., "A Newly Developed Electrical Twisting Ball Display," Proceedings of the SID, 1982, vol. 23, No. 4, pp. 249–253.

Sheridon et al., "The Gyricon–A Twisting Ball Display", Proceeding of the SID, 1977, vol. 18(3 & 4) pp. 289–293.

Yang, K.H., "The Investigation of Image Formation in a Large–Area Solid State X–Ray Receptor with Electrophoretic Display", J. Appl. Phys., Sep. 1983, vol. 54(9), pp. 4711–4721.

Vandegaer Jan E., "Microencapsulation: Processes and Applications ed.", American Chemical Society Symposium, Chicago, IL, 1973, pp. v–x, 1–180 (published by Plenum Press, New York, 1974).

Matsumoto et al., "Generation of Monodispered Concentric Two Phase Droplets for Encapsulation", ICLASS—'82, Reports & Proc. 2nd Int. Conf. On Liquid Atomization & Spray Systems, Jun. 20–24, 1982, pp. 63–67.

Drzaic et al., "A Printed and Rollable Bistable Electronic Display", 1998 SID International Symposium, Digest of Technical Papers, 1998, vol. 29, pp. 1131–1134.

Franjinone et al., "The Art and Science of Microencapsulation", Technology Today, 1995, no page numbers.

Matsumoto et al., "A Production Process for Uniform–Size Polymer Particles", Journal of Chemical Engineering of Japan, vol. 22, No. 6, 1989, pp. 691–694.

Esen, "Synthesis of Spherical Microcapsules by Photopolymerization in Aerosols", Colloid & Polymer Science, vol. 275, No. 2, 1997, pp. 131–137.

Matsumoto et al., "Production of Monodispersed Capsules", J. Microencapsulation, vol. 3, No. 1, 1986, pp. 25–31.

Soule, C.A., "E Ink Pens Deal with Lucent", Mass. High Technology, Jul. 10, 2000, pp. 1, 18.

Lee, L., "A Magnetic–Particles Display", Proc. Soc. Inf. Disp. (USA), vol. 16, No. 3 (1975), pp. 177–184.

Anchor Desk, "E–Paper Here Sooner Than You Think", http:/www.zdnet.com/filters/printerfriendly/0,6061, 2656348–10,00.html.

Business Wire, "EInk and Lucent Technologies Demonstrate World's First Flexible Electronic Ink Display with Plastic Transistors", http://www.zdnet.com/cgi–bin/printme.fcgi?t=zdii.

Kazlas, P. et al, "SVGA Microencapsulated Electrophoretic Active Matrix Display for Information Appliances", SID 01 Digest, pp 152–55.

Chen, Y. et al, "A Conformable Electronic Ink Display Using a Foil–Based a–Si TFT Array", SID 01 Digest, pp 157–59.

Amundson, K. et al, "Flexible, Active–Matrix Display Constructed Using a Microencapsulated Electrophoretic Material and an Organic–Semiconductor–Based Backplane", SID 01 Digest, pp 160–63.

* cited by examiner

POSITIVE

SILICONE ELASTOMER WITH SILICA FILLER
BOROSILICATE GLASS, FIRE POLISHED
WINDOW GLASS
ANILINE-FORMOL RESIN, ACID CATALYZED
POLYFORMALDEHYDE
POLYMETHYLMETHACRYLATE
ETHYLCELLULOSE
POLYAMIDE 11
POLYAMIDE 6-6
ROCK SALT (NaCl)
MELAMINE FORMOL
WOOL, KNITTED
SILICA, FIRE POLISHED
SILK, WOVEN
POLYETHYLENE GLYCOL SUCCINATE
CELLULOSE ACETATE
POLYETHYLENE GLYCOL ADIPATE
POLYDIALLYL PHTHALATE
CELLULOSE (REGENERATED) SPONGE
COTTON, WOVEN
POLYURETHANE ELASTOMER
STYRENE-ACRYLONITRILE COPOLYMER
STYRENE-BUTADIENE COPOLYMER
POLYSTYRENE
POLYISOBUTYLENE
POLYURETHANE FLEXIBLE SPONGE
BOROSILICATE GLASS, GROUND STATE
POLYETHYLENE GLYCOL TEREPHTHALATE
POLYVINYL BUTURAL
FORMO-PHENOLIQUE, HARDENED
EPOXIDE RESIN
POLYCHLOROBUTADIENE
BUTADIENE-ACRYLONITRILE COPOLYMER
NATURAL RUBBER
POLYACRYLONITRILE
SULFUR
POLYETHYLENE
POLYDIPHENYTOL PROPANE CARBONATE
CHLORINATED POLYETHER
POLYVINYLCHLORIDE WITH 25% DOP
POLYVINYLCHLORIDE WITHOUT PLASTICIZER
POLYTRIFLOUROCHLORETHYLENE
POLYTETRAFLOUROETHYLENE

NEGATIVE

FIG. 1c–1

(POSITIVE END)
SILICONE ELASTOMER WITH SILICA FILLER
BOROSILICATE GLASS, FIRE-POLISHED
WINDOW GLASS
ANILINE-FORMOL RESIN, (ACID CATALYSED)—$CH_2$—Ph—NH—
POLYFORMALDEHYDE—$CH_2$—O—
POLYMETHYLMETHACRYLATE—$CH_2$—$CMe(COOCH_2)$—
ETHYLCELLULOSE
POLYMIDE 11—$(CH_2)_{10}CO$—NH—
POLYMIDE 6-6—$(CH_2)_4CO$—$NH(CH_2)_5NH$—CO—
ROCK SALT $Na^+Cl^-$
MELAMINE FORMOL
WOOL, KNITTED
SILICA, FIRE-POLISHED
SILK, WOVEN
POLY-ETHYLENE GLYCOL SUCCINATE—$(CH_2)_2COO(CH_2)_2OCO$—
CELLULOSE ACETATE
POLY-ETHYLENE GLYCOL ADIPATE—$(CH_2)_4COO(CH_2)_2OCO$

POLY-DIALLYL PHTHALATE—$CH_2CH$—$OCOPhCOOCH$–$CH_2$

CELLULOSE (REGENERATED) SPONGE
COTTON, WOVEN
POLYURETHANE ELASTOMER—NHPhNHCOOROCO—
STYRENE ACRYLONITRILE COPOLYMER
STYRENE BUTADIENE COPOLYMER
POLYSTYRENE—$CH_2$—CHPh—
POLYISOBUTYLENE—$CH_2$—$CMe_2$—
POLYURETHANE FLEXIBLE SPONGE
BOROSILICATE GLASS, GROUND SURFACE
POLYETHYLENE GLYCOL TEREPHTHALATE—$COPhCGO(CH_2)_2O$—
POLYVINYL BUTURAL
FORMO-PHENOLIQUE, HARDENED—$CH_2$—PhOH—$CH_2$—
EPOXIDE RESIN—$OPhCMe_2PhOCH_2CHOHCH_2$—
POLYCHLOROBUTADIENE—$CH_2CCl$–$CHCH_2$—
BUTADIENE ACRYLONITRILE COPOLYMER
NATURAL RUBBER—$CH_2CMe$–$CHCH_2$—
POLYACRYLONITRILE—$CH_2$—CH(CN)—
SULFUR
POLYETHYLENE—$CH_2$—
POLYDIPHENYLOL PROPANE CARBONATE—$OPhCMe_2PhOCO$—
CHLORINATED POLYETHER—$CH_2$—$C(CH_2Cl)_2CH_2O$—
POLYVINYLCHLORIDE WITH 25% D.O.P.
POLYVINYLCHLORIDE WITHOUT PLASTICIZER—$CH_2$—CHCl—
POLYTRIFLOUROCHLORETHYLENE—$CF_2CFCl$—
POLYTETRAFLOUROETHYLENE—$CF_2$—
(NEGATIVE END)

FIG. 1c–2

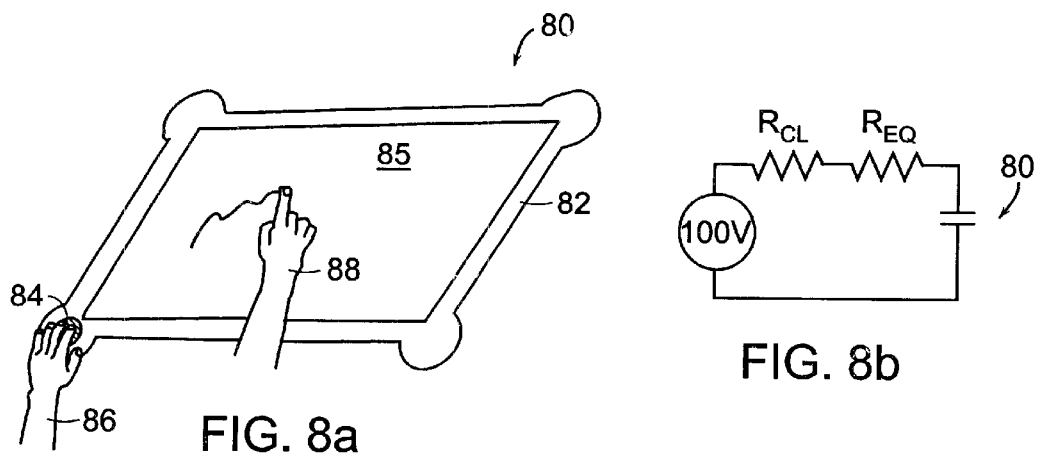
FIG. 8a
FIG. 8b
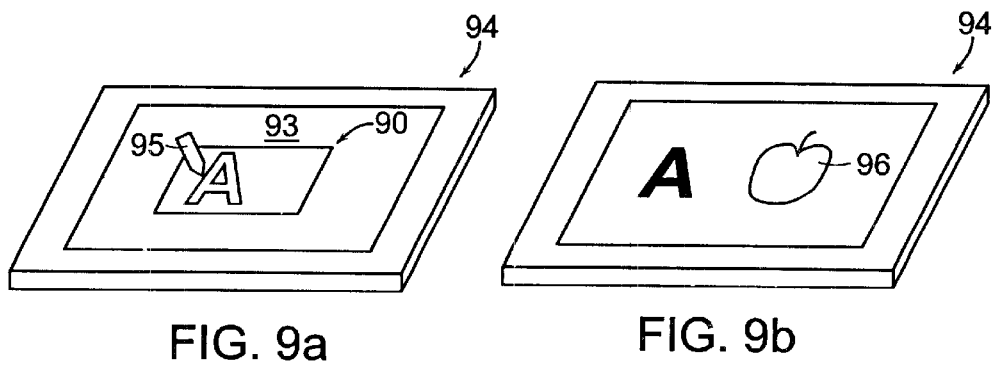
FIG. 9a
FIG. 9b
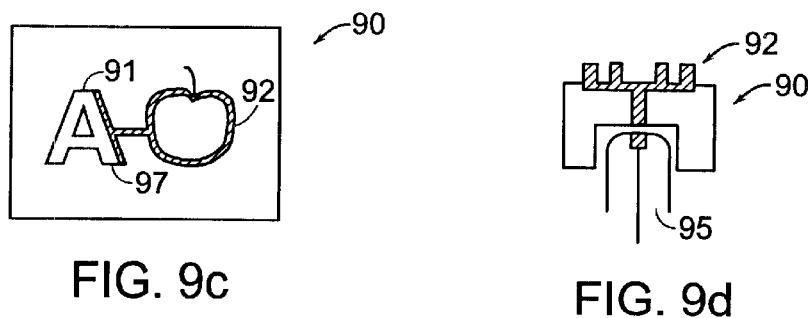
FIG. 9c
FIG. 9d

MICROENCAPSULATED ELECTROPHORETIC ELECTROSTATICALLY-ADDRESSED MEDIA FOR DRAWING DEVICE APPLICATIONS

RELATED APPLICATION

This invention claims priority to provisional application U.S. Ser. No. 60/085,096 filed on May 12, 1998.

FIELD OF THE INVENTION

This invention is related to a display device, and more specifically to a drawing device.

BACKGROUND OF THE INVENTION

An erasable drawing device is known. An erasable drawing device, typically, consists of a blackboard, paper pad, or white board, and an erasable marking device such as a chalk, pencil or dry-erasable marker.

One drawback of such drawing device is that the marking device can dissipate, requiring replacement. Another drawback is that the marking device can make marks on surfaces other than the screen of the drawing device, thereby creating a mess. Still another drawback is that the screen may not erase completely even with cleansers and vigorous erasing.

An electronic drawing device overcomes some the problems described above. An electronic drawing device, typically, includes a touch screen and appropriate logic to cause an underlying electronic display to update its image in response to the motion of a stylus. The device, for example, includes a graphics input pad having an array of transparent capacitive pixels, which change their capacitance in response to a conductive tipped stylus passing over the pad. The change in capacitance is sensed and used to address an LCD matrix. A drawback of this electronic drawing device is that it requires sophisticated electronics and significant amount of power. U.S. Pat. No. 4,639,720 describes an electronic drawing device.

A magnetophoretic display, typically used as children's drawing toy, is another example of an erasable drawing device. In a magnetophoretic display, a stylus used to write on the display contains a magnet, and a contrast media on the display contains black ferrous material and white titanium dioxide. The magnetophoretic display requires no power. However, the magnetophoretic display does not typically permit the user to selectively erase portions of a drawing on the display, unless the user is able to access both the front and back of the magnetophoretic media. Typically, manufacturers of magnetophoretic displays simply provide access to only one surface. The display is erased using a sliding bar magnet embedded behind the magnetophoretic media. Therefore, the display cannot be selectively erased.

An electrostatically-addressed liquid crystal display is another type of drawing device known in the art. Liquid crystal drawing devices, however, suffer from poor image duration due to dissipation of the surface static charge which maintains the image. With higher voltages and additional resistive layers, it is possible to extend image duration, but even then, a duration exceeding 30 minutes is considered state of the art. U.S. Pat. Nos. 5,351,143 and 5,117,297, describe liquid crystal drawing devices.

An electrophoretic display is also used as a drawing device. In an electrophoretic drawing device, electrophoretic particles in a display media of the device migrate toward or away from the drawing surface of the device upon application of an electric field across the display media. For example, the drawing device can contain a back electrode covered by an electrophoretic coating. To write, a positive voltage is applied to the back electrode and a stylus contacting the electrophoretic coating is set at ground. The stylus acts as a top electrode in a local area. A voltage potential is created between the stylus and the back electrode which causes migration of the electrophoretic particles and a color change of the device. The overall system may be covered with a dielectric or anisotropic top layer that protects the electrophoretic media. Chiang et al. "A Stylus Writable Electrophoretic Display Device," Society for Information Display 1979 Digest describes an electrophoretic drawing device. Although electrophoretic displays offer excellent contrast and brightness as well as favorable electrical properties and image duration, electrophoretic displays have not been broadly commercialized due to difficulty in manufacture and lifetime issues related to particle agglomeration and migration within the display.

SUMMARY OF THE INVENTION

In one aspect, the invention features a display. In one embodiment, the display comprises an encapsulated display media having a first surface and a second surface, a rear electrode disposed adjacent the second surface of the display media, and a movable electrode. The display media comprises a plurality of capsules, each capsule comprising a plurality of particles dispersed in a fluid. The movable electrode, in conjunction with the rear electrode, applies an electric field across the display media.

In one detailed embodiment, the movable electrode comprises a writing device. The writing device can comprise a charge generator. The charge generator can comprise an electronic circuit capable of increasing a voltage from about 20 V to about 1000 V. The charge generator can further comprise an electronic circuit, which reduces an applied voltage to zero after a predetermined time interval. The writing device can comprise a charge storage device. The writing device can comprise a stylus. For example, the stylus can comprise an electrode tip disposed within a curved end of the stylus. The stylus can further comprise a plurality of concentric electrodes. The writing device can include an activator, such as a piezoelectric device, which activates the charge generator. The writing device can have a first end and a second end. The display media displays a first color when the first end is disposed adjacent the first surface of the display media and a second color when the second end is disposed adjacent the first surface of the display media.

In another detailed embodiment, the movable electrode comprises an eraser. In still another detailed embodiment, the movable electrode comprises a user touching the first surface of the display media. In still another detailed embodiment, the movable electrode comprises a sliding bar, which slides across the first surface of the display media. The sliding bar can include a charge generator, an activator which activates the charge generator, an electrostatic print head, and/or a scanner. The charge generator can be a Van de Graaff device, a triboelectric mechanism, or a hand-driven electric generator. The sliding bar can communicate with a data storage device. Alternatively, the sliding bar can comprise a data storage device.

In still another detailed embodiment, the movable electrode comprises a switch, which reverses an electric field applied to the display media upon activation of the switch. For example, a color displayed on the first surface of the display media can change upon activation of the switch.

In one embodiment, the rear electrode comprises a first region having a voltage different from a voltage of the movable electrode and a second region having a voltage matching the voltage of the movable electrode. In another embodiment, the rear electrode comprises a conductive pattern. In still another embodiment, the display media comprises a plurality of electrophoretic particles comprising a plurality of colors, and the rear electrode comprises a plurality of pixel electrodes, each pixel electrode being set at a voltage for displaying particles of a selected color on the first surface of the display media. Alternatively, the rear electrode can be movable.

In another detailed embodiment, the display further comprises a touch screen disposed adjacent the first surface or the second surface of the display media. The touch screen can be laminated to the display media.

In another embodiment, the display comprises a display media forming a continuous loop, and an electrode disposed inside the continuous loop of the display media. In one detailed embodiment, the display further comprises a case containing the display media and the electrode. The case has a first surface and a second surface. The first surface comprises a protective layer and serves as a writing surface. In another detailed embodiment, the display further comprises a movable electrode. The movable electrode, in conjunction with the electrode, applies an electric field across the display media.

In still another embodiment, the display comprises a display media having a first surface and a second surface, an electrode disposed on the first surface of the display media, and a photoconductor disposed on the second surface of the display media. The display media displays a replica of an image shown on a substrate when the photoconductor is provided adjacent the substrate. In one detailed embodiment, the substrate comprises an emissive display such as a computer screen or a television screen.

In another detailed embodiment, the substrate comprises a reflective display. The reflective display can be a piece of paper. In another detailed embodiment, the display further comprises a light source for illuminating the substrate.

In another aspect, the invention features a method for creating an image on a display. The method comprises the steps of: (a) providing a display comprising an encapsulated display media comprising a plurality of capsules, each capsule comprising a plurality of particles dispersed in a fluid, the display media having a first surface and a second surface and a rear electrode disposed on the second surface of the display media; (b) placing a movable electrode adjacent the first surface of the display media; and (c) applying an electric field across the display media through the movable electrode and the rear electrode, thereby creating an image on the first surface of the display media.

In another aspect, the invention features a method for reproducing an image. The method comprises the steps of: (a) providing a display comprising: a1) a display media comprising a first surface and a second surface, a2) an electrode disposed on the first surface of the display media, and a3) a photoconductor disposed on the second surface of the display media; and (b) placing the photoconductor adjacent a substrate comprising an image, thereby reproducing the image from the substrate on the display media.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which:

FIG. 3b shows a bottom view of the stylus of FIG. 3a.

FIG. 8a shows a perspective view of a display according to one embodiment of the invention.

FIG. 8b shows a simplified circuit diagram of the display of FIG. 8a.

FIGS. 9a shows a perspective view of a display used with a writing implement according to one embodiment of the invention.

FIG. 9b shows a perspective view of a display comprising a drawing made with the writing implement of FIG. 9a according to one embodiment of the invention.

FIG. 9c shows a plan view of a writing implement according to one embodiment of the invention.

FIG. 9d shows a cross-sectional view of a drawing implement and a stylus according to one embodiment of the invention.

FIG. 14b illustrates the rear electrodes of the display of FIG. 14a.

DETAILED DESCRIPTION

Figure 1A:
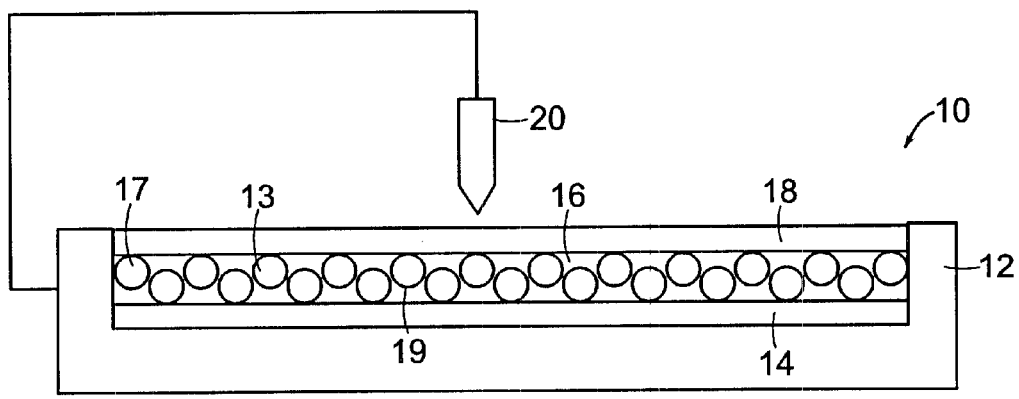
FIG. 1a shows a cross-sectional view of a display according to one embodiment of the invention.

Referring to FIG. 1a, a display 10 includes a casing 12, a rear electrode 14 disposed inside the casing 12, an encapsulated display media 16 disposed adjacent the rear electrode 14, a protective layer 18 disposed adjacent the display media 16, and a movable electrode 20. The display 10 can be used as a drawing system. The protective layer 18 serves as a drawing surface. The movable electrode 20 comprises a charge conducting mechanism. In one embodiment, the movable electrode 20 is a writing device. In the embodiment of FIG. 1, the writing device 20 comprises a stylus. Alternatively, the display 10 of the present invention can be addressed mechanically by means of a robotic arm or charge-carrying print head that is moved relative to the drawing surface. For example, an electrostatic printer can be used to draw on the drawing surface. When the movable electrode 20 contacts the drawing surface 18, the movable electrode 20 and the rear electrode 14 apply an electric field across the display media 16, and thereby display an image on the drawing surface 18 of the system 10.

In one embodiment, the casing 12 is made from a plastic container capable of holding the display media 16, the rear electrode 14, and any necessary electronics. Alternatively, the casing 12 can be made of any other material. The casing 12 may be of any size, ranging from small for toy applications and large for applications in presentation displays. The casing 12 can also include compartments for storing the drawing instrument 20 and other accessories such as an eraser.

In one embodiment, the encapsulated display media 16 includes a particle-based display media. In one detailed embodiment, the particle-based display media is made from an electronic ink. An electronic ink is an optoelectronically active material which comprises at least two phases: an electrophoretic contrast media phase 17 and a coating/binding phase 19. The electrophoretic phase 17 includes, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase 17 is encapsulated, that is, there is a capsule 13 wall phase between the two phases.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

In one embodiment, a capsule 13 is filled with a plurality of particles and a dyed suspending fluid. In one detailed embodiment, the particles are titania particles. When a direct-current electric field of the appropriate polarity is applied across the capsule 13, the particles move to the drawing surface 18 and scatter light. When the applied electric field is reversed, the particles move to the rear surface of the display media 16 and the drawing surface then appears dark.

In another detailed embodiment, the capsule 13 includes a first set of particles and a second set of particles in the capsule 13. The first set of particles and the second set of particles have contrasting optical properties. For example, the first set of particles and the second set of particles can have differing electrophoretic mobilities. In addition, the first set of particles and the second set of particles can have contrasting colors. For example, the first set of particles can be white, while the second set of particles can be black. The capsule further includes a substantially clear fluid. The capsule has a rear electrode 14 on one side and a writing instrument comprising an electrode on the other side. The electrodes 13, 20 are connected to a source of voltage (not shown), which may provide an alternating-current (AC) field or a direct-current (DC) field to the capsule 13. Upon application of an electric field across the electrodes 13, 20, the first set of particles move toward the drawing surface 18, while the second set of particles move toward the rear electrode 14.

In another detailed embodiment, the display media 16 is formed with a suspended particle display media. The suspended particle display media includes needle-like particles in a transparent fluid. The particles change their orientation upon application of an AC field across the electrodes. When the AC field is applied, the particles are oriented perpendicular with respect to the drawing surface 18 and the surface appears transparent. When the AC field is removed, the particles are randomly oriented and the display drawing surface 18 appears opaque. Commonly-owned, co-pending U.S. patent application Ser. No. 09/140,792 filed on Aug. 27, 1998, which describes electrophoretic displays, is incorporated herein by reference.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include conducting or semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

In one embodiment, the display media 16 includes a binder material which binds the capsules 17 together. The binder is used as a non-conducting, adhesive medium supporting and protecting the capsules, as well as binding the electrode materials to the capsule dispersion. Binders are available in many forms and chemical types. The coating/binding phase 19 includes, in one embodiment, a polymer matrix that surrounds the electrophoretic phase 17. In this embodiment, the polymer in the polymeric binder is capable of being dried, crosslinked, or otherwise cured as in traditional inks, and therefore a printing process can be used to deposit the electronic ink onto a substrate. In another embodiment, the binder material can be water-soluble polymers, water-borne polymers, oil-soluble polymers, thermoset and thermoplastic polymers, or radiation-cured polymers.

Among the water-soluble polymers are the various polysaccharides, the polyvinyl alcohols, N-methyl Pyrollidone, N-vinyl pyrollidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×G, the capsules are found at the bottom of the centrifuge tube, while the water portion is at the top. The water portion is carefully removed. The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the waterborne system, with the obvious exception of the water itself. The latitude in formulation for solvent systems is enormous, limited only by solvent choices and polymer solubility. Of considerable concern in solvent-based systems is the viability of the capsule itself—the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

In one detailed embodiment, the binder material renders the display media elastomeric. For example, a binder material including polyurethane can render the display media elastomeric. In another embodiment, the binder material renders the display media brittle. For example, a binder material comprising an epoxy can render the display media brittle. In another embodiment, the binder material has ultraviolet light protective properties, for example, by incorporated ultraviolet light absorbers, such as benzotriazole derivative material, in the binder. A display media having an elastomeric and/or UV protective material increases durability and lifetime of the display 10.

Encapsulation of the electrophoretic suspension serves as a superior media for use in drawing devices and as a substrate for electrostatic printing. The benefits of microencapsulation for such purposes derive from the polymeric nature of the microcapsule wall and surrounding binder, which offers greater structural integrity than a non-encapsulated electrophoretic suspension. In addition, encapsulated electrophoretic suspensions overcomes the problems encountering by prior electrophoretic drawing devices in which support walls were used as spacers. These walls cause gaps in the image and reduce the total addressable portion of the display. A microencapsulated electrophoretic media is inherently supported and does not require such imageinterrupting walls. Therefore, it is possible to achieve a continuous image tracing.

In addition, the encapsulated display media 16 can be coated directly onto a plastic substrate in a process which offers a means of economical production for large surface areas. Furthermore, encapsulated display media 16 can be made flexible or set into curves and contours. This offers new manufacturing processes and design capabilities.

Although encapsulated electrophoretic drawing system requires some electrical charge, it operates by field effect and hence draws minimal power. Further, some electrophoretic systems exhibit bistability such that once they are addressed to a dark or light state, they stay dark or light without any further power requirement, and some systems can even maintain a gray state without power. Such images can last for several months or more without requiring any further power.

In one embodiment, the protective layer 18 is made from lexan, polycarbonate, or mylar. In another embodiment, the protective layer 18 includes an ultraviolet light protective coating. For example, the coating can be imbued with UV-protective polymer material such as polyvinylfluoride or LEXAN HP 12W (polycarbonate base) or other light stabilizing additives such as Benzotriazole or Hydroperoxide decomposer (e.g., HALS, Hindered Benzoate and Phosphite), or combination of these materials. In another embodiment, the protective layer 18 is a scratch resistant coating. In still another embodiment, the protective coating 18 is made from a material, which reduces grease and oil build-up on the screen surface.

Referring to FIG. 1a, the display 10 further includes a charge-generating mechanism (not shown). The charge-generating mechanism can be incorporated in the casing 14, or the movable electrode 20. In one embodiment, the charge-generating mechanism is a battery and an electronic circuit, which is capable of increasing a voltage into a range from 20 volts to 1000 volts or more, and more preferably from 100 volts to 500 volts. In another embodiment, the charge-generating mechanism includes a circuit which automatically reduces an applied voltage to zero after a predetermined period of time to preserve batteries. In another embodiment, the charge-generating mechanism has a safety mechanism to prevent shocking the user. For example, the charge-generating mechanism can use resistors to limit maximum current drawn from the charge-generating mechanism. In general, the resistance should be sufficient to keep the generated current to a level below that which can be felt by the user. In still another embodiment, the charge-generating mechanism can have an interlock mechanism. The interlock mechanism prevents the user from simultaneously contacting the writing instrument and another charge-carrying device such as an eraser to be described. For example, at least one of the terminals of the writing instrument and the eraser can be adapted to disconnect when the user comes in contact with both.

Figure 1B:
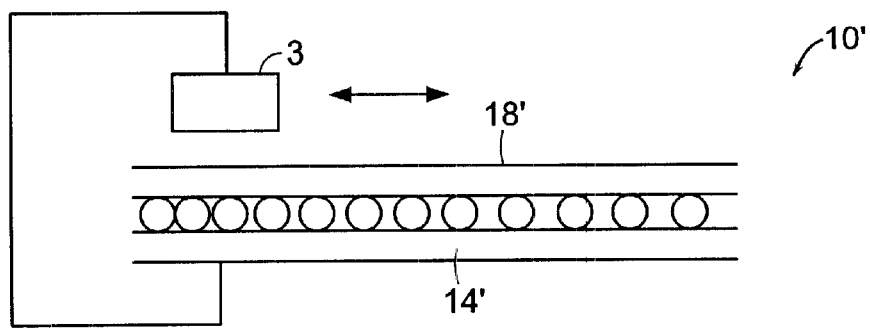
FIG. 1b shows a partial cross-sectional view of a display according to one embodiment of the invention.
Figure 1C:
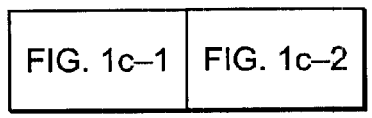
FIG. 1c is a chart providing two series of triboelectric elements.

In another embodiment, the display 10 includes means for generating an electrostatic charge, such as Van de Graff generator, fluid pumps, or triboelectric forces. A Van de Graff generator generates high voltage by providing physical separation of charge through a belt. A fluid pump generates high voltage by providing physical separation of charge through fluid displacement. FIG. 1b illustrates a display 10' using a triboelectric force. The system 10' includes a rear electrode 14' in electrical communication with a slider 3. The slider 3 slides across the protective layer 18', thereby generating a static charge. The static charge can be stored in a capacitor and discharged as the user writes. This embodiment does not require a battery. FIG. 1c is a chart providing two series of triboelectric elements from which an appropriate slider material and the protective layer can be selected.

In one embodiment, the display 10 has an intervening dielectric layer. The dielectric layer can be placed between the protective layer 18 and the display media 16, be incorporated into the protective layer 18, or be incorporated into the binder material. The dielectric layer can store electric charge long enough to address the display media, without bleeding the charge. The dielectric layer also allows applied voltage to pass through the layer and reach the display media. In this manner, the writing speed on the writing device can be increased, since the writing device need not be positioned above the display media for a duration necessary to address the display media. In one embodiment, the dielectric layer is fabricated from a cross-linked polymer layer. In one detailed embodiment, the dielectric layer is fabricated from a film made of, for example, polyethylene phthalate, polyethylene naphthalate, polypropylene, polyethylene, polyvinylchloride, polysulfone, polyphnylene oxide, ionomer, polycarbonate, nylon or fluororesin layered with a bond or adhesive or such.

Figure 2:
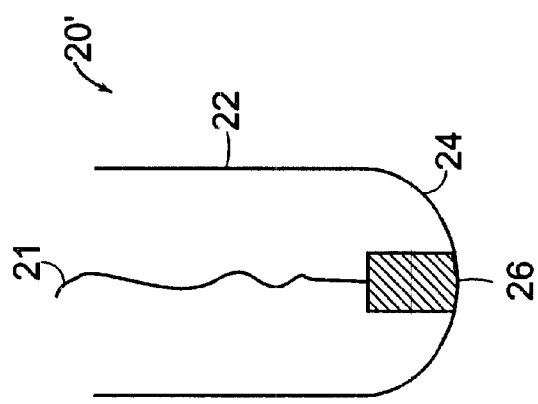
FIG. 2 shows a cross-sectional view of a stylus for addressing a display according to one embodiment of the invention.

Referring to FIG. 2, a stylus 20' comprises an elongated probe 22 with a tip 24. In one embodiment, the tip 24 may be shaped small to permit drawing of a fine line. The tip 24 includes an electrode 26 which is flush with a surface of the tip 24. In some embodiments, the electrode 26 encompasses a smaller area than the tip 24. The electrode 26 is connected to a voltage source (not shown) through a wire 21. In some embodiments, the tip 24 is rounded. This configuration of the stylus 20' permits a wider area of the stylus 20' to come into contact with a drawing surface, while allowing a fine line to be drawn without puncturing the drawing surface. In one embodiment, the electrode 26 is covered with a dielectric coating, which protects the stylus 20' and prevents exposure of the electrode 26 to the environment. In another embodiment, the tip 24 of the stylus 20' comprises an elastomeric material.

In another embodiment, the stylus includes a damping mechanism such as a spring built into the tip as to cushion the drawing surface from the physical forces caused by the motion of the user's hand.

Figure 3B:
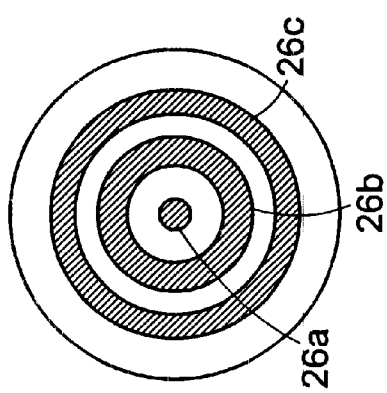
Figure 3A:
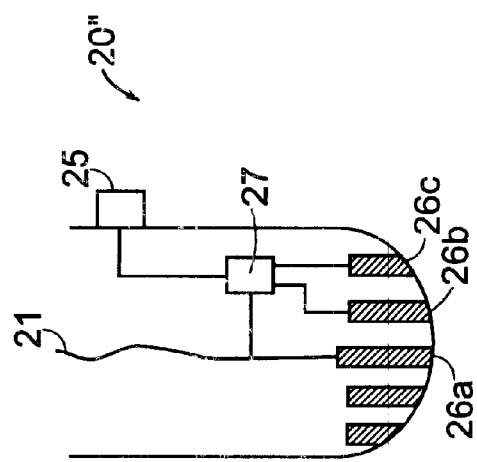
FIG. 3a shows a cross-sectional view of a stylus for addressing a display according to one embodiment of the invention.

FIGS. 3a and 3b depict another embodiment in which a stylus 20" includes multiple electrodes 26a, 26b, 26c, that are insulated from each other. A voltage can be applied to all or any of the electrodes 26a, 26b, 26c, thereby controlling the width and shape of the line drawn on the drawing surface. For example, when an electric field is applied through only the electrode 26a, a thin line is drawn on the drawing surface. However, when an electric field is applied through both the electrodes 26a, 26b, a thicker line is drawn, and even a thicker line is drawn when an electric field is applied through all three electrodes 26a, 26b, 26c. In one embodiment, the stylus 20" includes a switch 25, and a logic circuit 27 which activates the various electrodes 26a, 26b, 26c.

In one embodiment, the width of the line drawn on the drawing system is controlled by varying the voltage potential applied across the display media. For example, the duty cycle or the magnitude and/or duration of voltage applied can be varied.

Figure 4A:
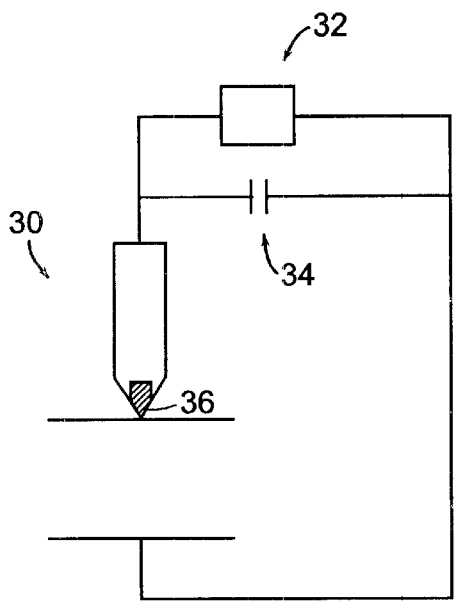
FIG. 4a shows a schematic view of a stylus for addressing a display according to one embodiment of the invention.
Figure 4B:
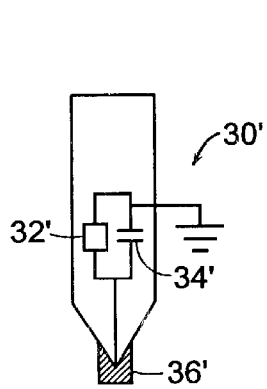
FIG. 4b shows a cross-sectional view of a stylus for addressing a display according to one embodiment of the invention.
Figure 4C:
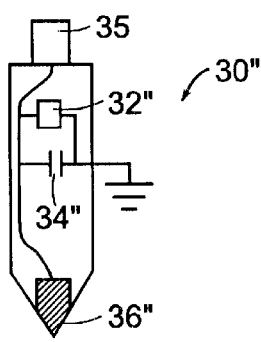
FIG. 4c shows a cross-sectional view of a stylus for addressing display according to one embodiment of the invention.

FIGS. 4a–4c depict other embodiments in which a stylus 30 includes a charge generating device 32 and/or charge-storage device 34. In the embodiments of FIGS. 4a–4c, the charge-generating device can be a piezo electric device 32, 32', 32" and the charge storage device can be a capacitor 34, 34', 34". Alternatively, the display 10" can include a voltage source 5 and a charge storage device 34 external to the stylus 30, as illustrated in FIG. 4e. Referring to FIG. 4b, pressing the stylus 30' against the drawing surface through a natural drawing motion mechanically triggers the piezo electric device 32' to generate a current and to charge the capacitor 34'. Referring to FIG. 4c, a switch 35 on the stylus 30" can be clicked to trigger the piezo electric device 32' to generate a current and to charge the capacitor 34".

In one embodiment, the stylus includes a switch which permits the user to reverse the electric field applied across the display media, and thereby switch from drawing in one color to drawing in another color. The second color may have the effect of erasing what is drawn using the first color. For example, the user can draw in blue on a white background prior to switching, and draw in white on a blue background after switching. In one example, the voltage applied to the electrode 36 can switch from +100 v to −100 v, where the voltage applied to the rear electrode of the drawing device is 0 v. Alternatively, the voltage applied to the electrode 36 of the stylus 30 can remain 0 v and the voltage applied to the rear electrode varied.

Figure 4D:
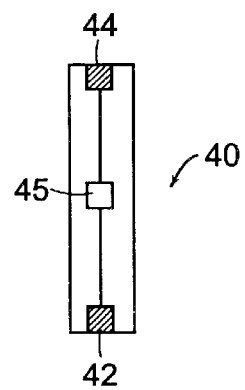
FIG. 4d shows a cross-sectional view of a stylus for addressing a display according to one embodiment of the invention.
Figure 4E:
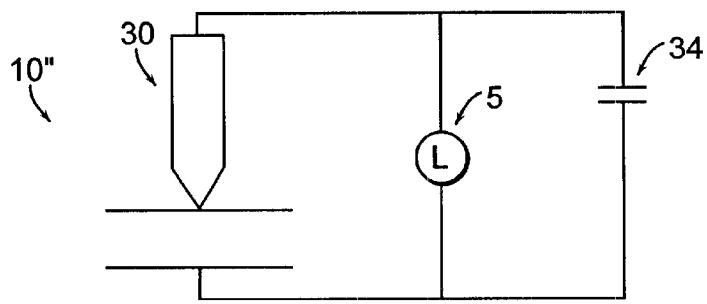
FIG. 4e shows a schematic view of a stylus for addressing a display according to one embodiment of the invention

Referring to FIG. 4d, the stylus 40 includes two electrodes 42, 44 placed at opposite ends of the stylus 40. Different voltages are applied to each of the electrodes 42, 44, such that electrode 42 allows the user to draw in one color, while electrode 44 allows the user to draw in a different color. In another embodiment, a positive voltage can be applied to electrode 42 to write on the drawing surface, while a negative voltage of the same magnitude can be applied to electrode 44 to erase the drawing on the drawing surface. The switch 45 allows the user to select one of the two electrodes 42, 44. In this embodiment, the rear electrode is set to ground.

Figure 5:
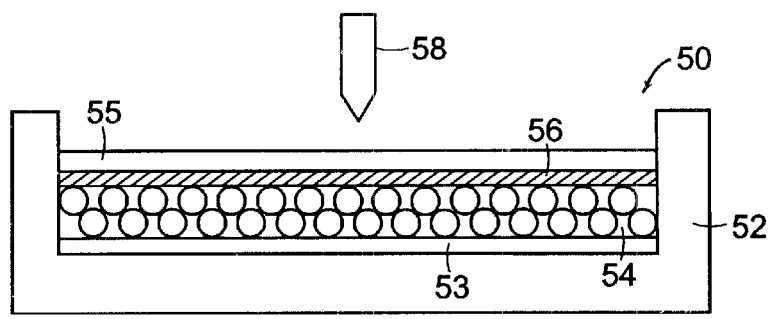
FIG. 5 shows a cross-sectional view of a display according to one embodiment of the invention.

Referring to FIG. 5, a display 50 includes a casing 52, a rear electrode 53 disposed inside the casing 52, an encapsulated display media 54 disposed adjacent the rear electrode 53, a piezoelectric film 56 disposed adjacent the display media 54, and a protective layer 55 disposed adjacent the piezoelectric film 56. In this embodiment, the stylus 58 need not be electrically connected to the drawing device 50 or include a charge generator. When a force is applied to the piezoelectric film 56 by pressing it with the stylus 58, the piezoelectric film 56 becomes charged. Thus a voltage potential can be created cross the display media 54 through the piezoelectric film 56 and the rear electrode 53. The piezoelectric 56 film can comprise a polymeric material. For example, the piezoelectric film can comprise vinylidene fluoride homopolymer or a copolymer of vinylidene fluoride and one or more copolymerizable monomers. The display media 54 includes capsules, each capsule comprising a plurality of particles dispersed in a fluid medium.

Figure 6:
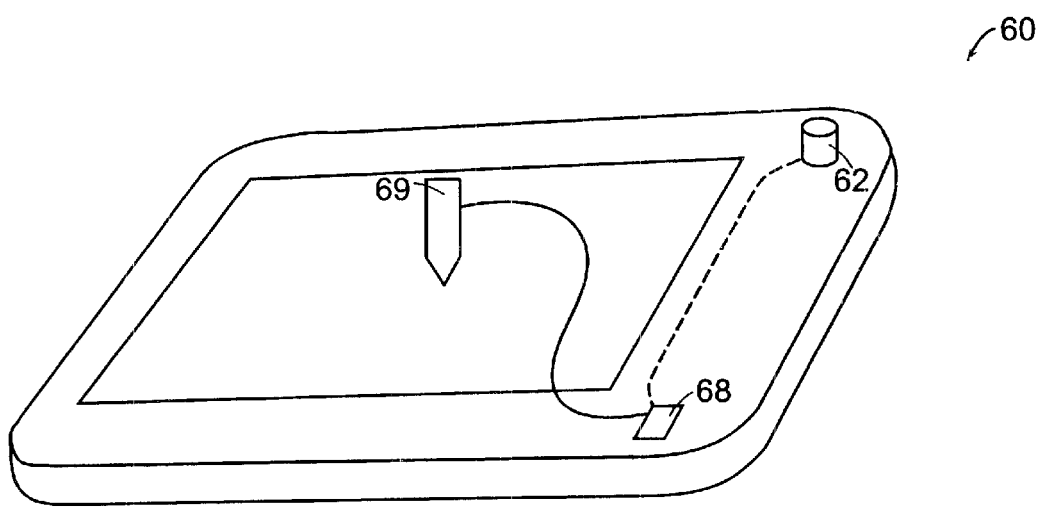
FIG. 6 shows a perspective view of a display according to one embodiment of the invention.

Referring to FIG. 6, a drawing system 60 which is substantially similar to the display of FIG. 1a further includes a piezo electric button 62 connected to a capacitor 68. The capacitor is connected to the stylus 69. When the user presses the piezo electric button 62, the capacitor 68 becomes charged. The system 60 can further include means for mechanically storing energy using, for example, a spring and subsequently transferring the mechanical energy to the piezo electric device 62.

Figure 7A:
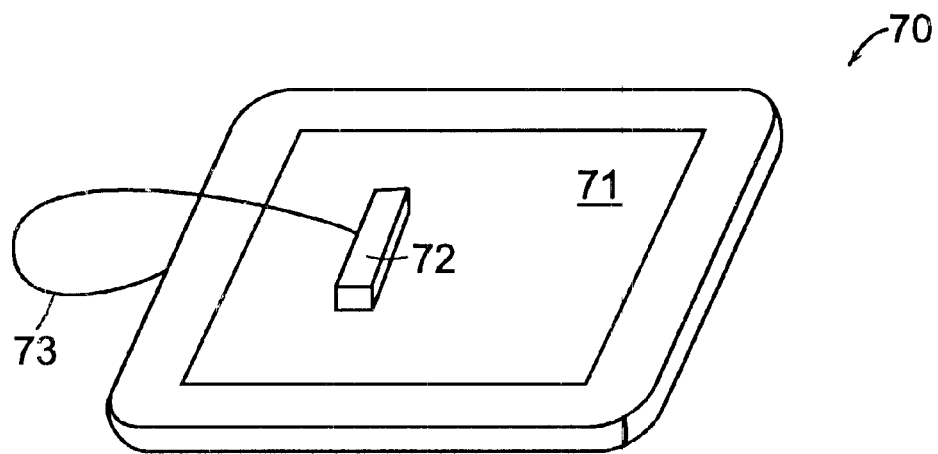
FIG. 7a shows a perspective view of a display according to one embodiment of the invention.
Figure 7B:
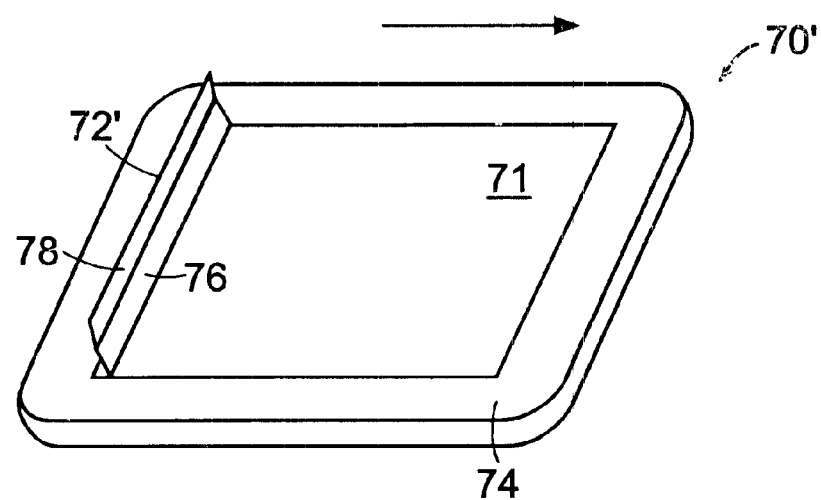
FIG. 7b shows a perspective view of a display system according to one embodiment of the invention.

Referring to FIG. 7a, a drawing system 70 which is substantially similar to the display of FIG. 1a further includes an eraser 72. The eraser 72 is physically connected to the drawing system 70 through a cable 73. An image created on the drawing surface 71 by applying an electric field across the display media of the drawing system 70 through the writing instrument (not shown) and the rear electrode (not shown) can be erased by applying an oppositely charged electric field across the display media through the eraser 72 and the rear electrode. In one embodiment, the eraser 72' is positioned inside the device casing 74 above the drawing surface 71 in the form of a sliding bar 76 as shown in FIG. 7b. The sliding bar 76 includes a tab 78, which the user can use to slide the eraser bar 76 across the drawing surface 71, thereby erasing an image drawn on the drawing surface 71. In one embodiment, the sliding bar 76 has an electrode which can be set to positive or negative voltage to cause the screen to change its color.

Referring to FIG. 8a, a drawing system 80 includes a casing 82, a rear electrode, an encapsulated display media, a protective layer, and an electrode surface 84. The protective layer 85 functions as the drawing surface. In this embodiment, a user touches the electrodes surface 84 with his or her first hand 86, while the user writes on the drawing surface 85 with the second hand 88. In this embodiment, a separate writing instrument may not be necessary. A voltage source is placed inside the casing 82. Since the human body is electrically conductive, an electric field can be created across the display media through the user's second hand 88 and the rear electrode. As illustrated in FIG. 8b, a typical skin resistance is about 10 k Ω–500 k Ω. As long as equivalent resistance ($R_{EQ}$) of display is much higher than the skin resistance, most of the applied field will drop across the system. In one embodiment, the drawing system 80 has an internal 1 m Ω current limiting resistor ($R_{CL}$) When 100 V is applied, the resistor ($R_{CL}$) would limit current flowing though the body and the display system to 100 k Ω. The electrode surface 84 can be a button. Alternatively, the electrode surface 84 can be a part of a stylus.

In one embodiment, the movable electrode of the present invention can have a variety of shapes or forms to provide different drawing tips. For example, the movable electrode can include a calligraphic tip, brush, sponge, fabric, roller, or elastomeric solid, which is electrically connected to a source of charge such an electrode surface, a voltage source, or a stylus. In another example, the writing instrument can comprise a non-conductive object coated with a conductive layer. In still another example, the writing instrument can be cones, shapes and cards. In still another example, the movable electrode can comprise a stamp in any shape or form.

Referring to FIGS. 9a–9d, a writing implement 90 can be used with the drawing system of the present invention. The writing implement 90 can be in the form of a card. The writing implement 90 includes an invisible conductive pattern 92 printed on the back side of the card. When the writing implement 90 is placed on a drawing surface 93 of the drawing system 94a and a voltage is applied to the conductive pattern 92 using a stylus 95, the conductive pattern leaves a surprise image 96 on the drawing surface 93. In the embodiment of FIGS. 9a–9c, the writing implement 90 includes a cut out hole 91 in the form of letter A. When using this writing implement 90, the user places the writing implement 90 on the drawing surface 93 and fills in the letter A using the stylus. An edge of the cut out hole 91 includes a conductor 97 which is connected to the conductor pattern 92. Thus, when the stylus contacts the conductor 97, a surprise image 96 corresponding to the conductor pattern 92 appears on the drawing surface. When the drawing implement 90 is removed from the drawing surface 93, the letter A remains, but next to it a picture of an apple 96 is also shown. The embodiment can be useful as a teaching tool for children.

Figure 10:
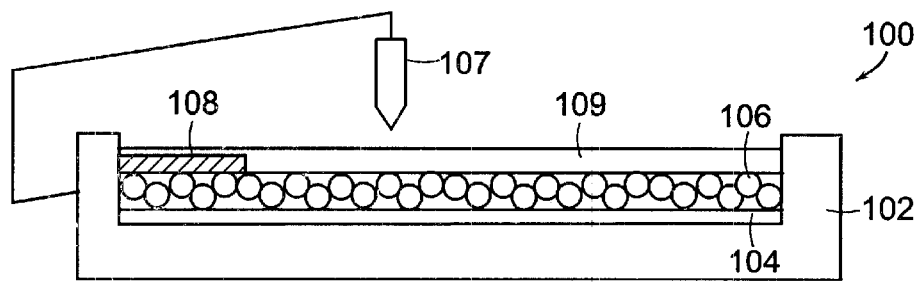
FIG. 10 shows a cross-sectional view of a display according to one embodiment of the invention.

FIG. 10 depicts an embodiment in which a display 100 has both erasable and non-erasable portions for flexibility. Referring to FIG. 10, the display 100 includes a casing 102, a rear electrode 104, an encapsulated display media 106, a top electrode 108, a protective layer 109, and a stylus 107. In this embodiment, a first portion of the drawing device 100 is available for the user to draw on, while a second portion of the drawing device 100 provides a predetermined image. In the second portion, the top electrode 108 and the rear electrode 104 apply an electric field across the display media 106. For example, an animated figure can be provided on the drawing surface 109 using this embodiment. A figure holding a "BLUE" sign can appear when the stylus 107 is set to draw in blue, and the "WHITE" sign can appear when the stylus 107 is set to draw in white.

The display of the present invention can be integrated with other multimedia elements including audio feedback tones or music, to enhance the drawing experience. For example, a speaker included in the display can emit sound when the stylus is toggled from a first voltage to a second voltage.

Figure 11:
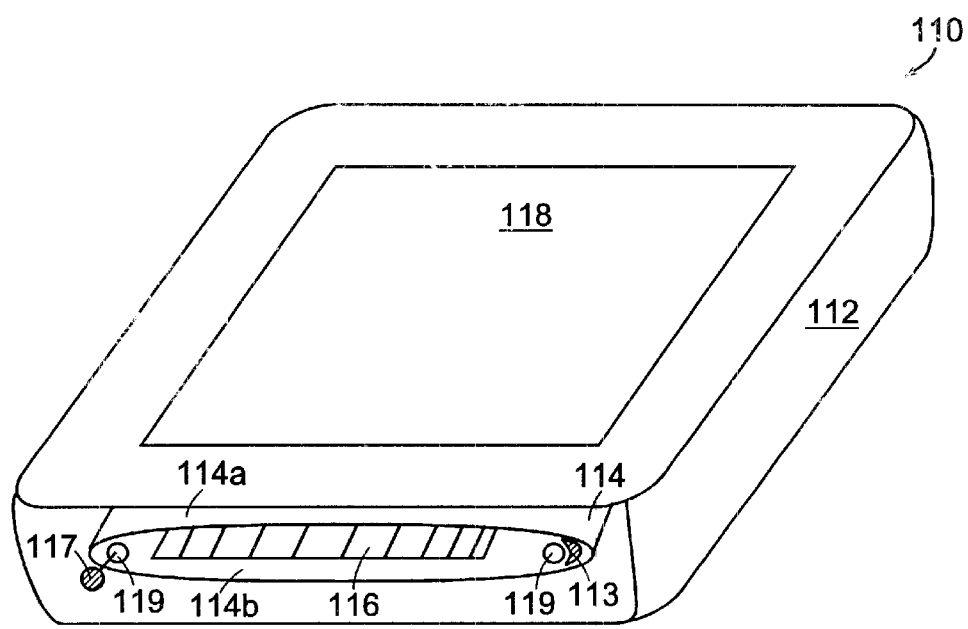
FIG. 11 shows a perspective view of a display according to one embodiment of the invention.

Referring to FIG. 11, a display 110 provides multiple drawing surfaces. The display 110 includes a casing 112, a flexible display media 114 arranged in a continuous belt loop, a rear electrode 116 disposed inside the belt loop, and a protective layer 118 serving as a drawing surface The display media 114 loops around a pair of rollers 119 and a knob 117 for rolling the belt loop. In this embodiment, the user can roll between different drawing surfaces. For examples the user can draw on the first drawing surface of the display media, 114*a*, then roll it to the back in order to save the drawing, and still have another fresh drawing surface, 114*b*. In one embodiment, the display media 114 comprises an encapsulated electrophoretic display media In one detailed embodiment, the first drawing surface of the display media, 114*a*, provides a first color combination such as black and white, while the second drawing surface of the display media, 114*b*, provides a second color combination such as yellow and blue. In another embodiment, the display 110 further includes an elaser 113, which erases the surface of the display media 114 as it rolls back.

In one embodiment, a display of the present invention is flexible. In one detailed embodiment, the flexible display is used as a wallpaper which provides a drawing surface. The display can be constructed by coating a transparent protective layer with an encapsulated electrophoretic display media and then laminating this coated structure with a rear electrode. Examples of flexible, transparent protective layer include polyester, polycarbonate, polyvinylfluoride, acrylic, and polychlorotriflouroethylene. The rear electrode can comprise a flexible polymeric conductor material such as conductive particle doped with polymers, conductive polymers (e.g., polyaniline, polyacetylene, polythiophene), doped polymers, metallized polymers, or polymer film coated with conductive material (e.g., metal, metal oxide, conductive particle dispersion, and conductive polymer dispersion). In another embodiment, the display media and the rear electrode are printed on the protective layer. Details of the printing methods are described in commonly owned U.S. patent application Ser. No. 08/935,800 filed on Sep. 23, 1997, incorporated herein by reference.

In another detailed embodiment, the flexible display can be used as an "electronic paper." An electronic paper can be used anywhere paper is used today but offers the ability to be updated via stylus, printhead or similar means. An electronic paper can be used as reusable fax and copier paper, re-writable bar-codes, labels and packaging, re-writable displays on plastic cards, credit cards, laminated driver's licenses and magnetic strip cards, reprintable signs and billboards, and reusable newspapers, magazines, greeting cards and books.

In one embodiment, the encapsulated display media or the display media in combination with the rear electrode of the drawing system can be removed and replaced with a fresh display media or display media/rear electrode combination by the user, such that the user can keep his or her drawings. In another embodiment, the rear electrode of the drawing system can be removed and replaced with a different rear electrode. In these embodiments, the system may include a connector which provides electrical communication between a voltage source and the rear electrode. These removable electrodes would permit a variety of rear electrode patterns to be used with the drawing system. For example, the electrode can be patterned to include a first section connected to the ground and a second section connected to the stylus potential. In this embodiment, the first section connected to ground can be revealed when the stylus is placed adjacent the first section. This embodiment can be used to create a coloring book. In another example, an outline can be provided on the drawing surface using this embodiment. The user first sets the entire drawing surface to display a single color such as blue. A rear electrode having a non-conductive pattern of an outline such as a map is inserted in the drawing system. An electric field is applied to the display media of the drawing system to change the color of the display from blue to another color, such as white. The outline of the map remains in blue, while the rest of the display becomes white. The user can now write on the drawing surface in blue and may write visibly over the map shown on the drawing surface.

Figure 12A:
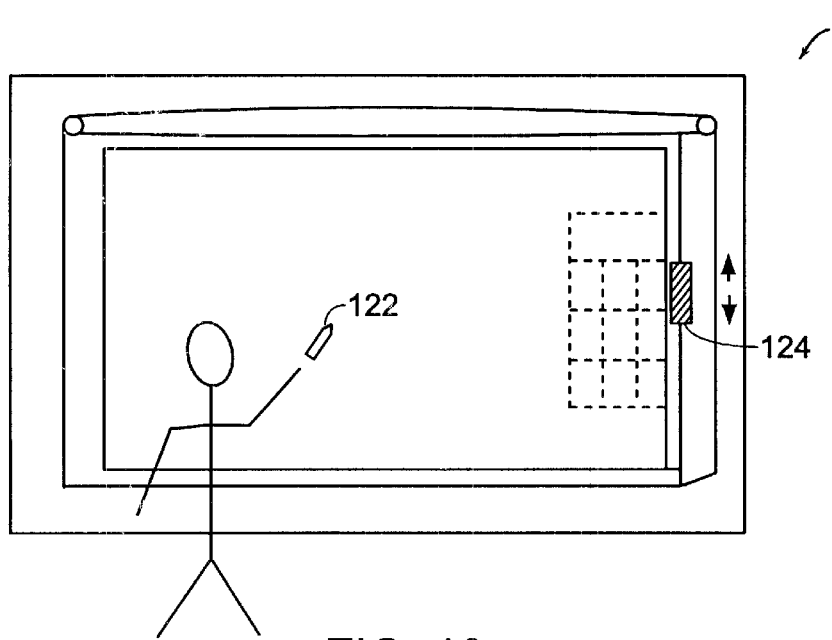
FIG. 12a shows a plan view of a display according to one embodiment of the invention.

Referring to FIG. 12*a*, a drawing system 120 permits the user to write using a stylus or a charge-generating electrostatic print head 124. In one embodiment, an electrostatic print head 124 is moved across a fixed electrophoretic display media to create an image. In one embodiment, the electrostatic print head 124 senses its location on the drawing system 120 such that it can print locally on the display surface. The drawing system 120, in this embodiment, can be used as a printer. The electrostatic print head 124 can move automatically or manually. The system 120 can further include a speed sensor for detecting manual scanning of the print head.

Figure 12B:
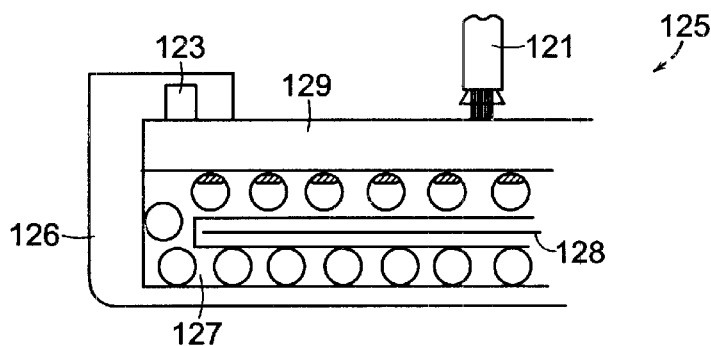
FIG. 12b shows a cross-sectional view of a portion of a display according to one embodiment of the invention.

In one embodiment, a drawing system employs both electrophoretic effect and other means to permit a user to draw on the system. Referring to FIG. 12*b*, the system 125 includes a casing 126, an encapsulated display media 127 in the form of a belt loop, a rear electrode 128 disposed within the belt loop, and a protective coating 129. The system 125 further includes an electrostatic printer 123 for providing an underlying image on the drawing surface 129. In addition, the user can use a standard dry-erasable marker 121 to draw on the drawing surface 129 as is typically used on white boards. Both the underlying image and the user's markings are visible on the drawing surface 129. In one detailed embodiment, the drawing system 125 further includes an optical input means (e.g., scanner) for scanning a drawing provided by the standard dry-erasable marker 121.

Figure 13:
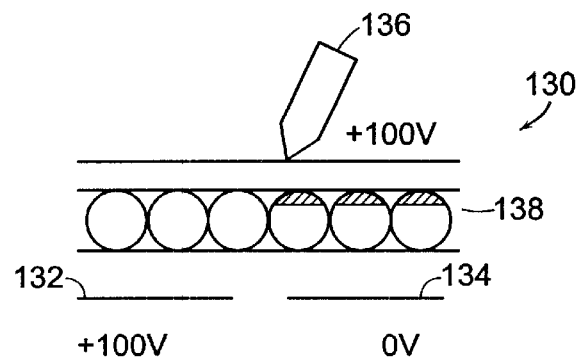
FIG. 13 shows a cross-sectional view of a portion of a display according to one embodiment of the invention.

In one embodiment, the drawing system includes a first region which displays a permanent image and a second region in which the user can write on and erase. For example, the drawing system can include a blank map or a blank calendar. Referring to FIG. 13, the drawing system 130 includes the rear electrode separated into multiple regions 132, 134. The first region 132 has a voltage equal to the voltage of the stylus 136, such that an electric field cannot be applied across the display media 138 adjacent the first region 132. Therefore, the user cannot write on or erase on the first region 132. The second region 134 has a voltage different from the voltage of the stylus 136, such that an electric field can be applied across the display media 138 adjacent the second region 134. The user draws on the second region 134. The drawing system 130 can include a rear electrode having an electrode pattern corresponding to an image to be permanently displayed on the drawing system 130.

Figure 14A:
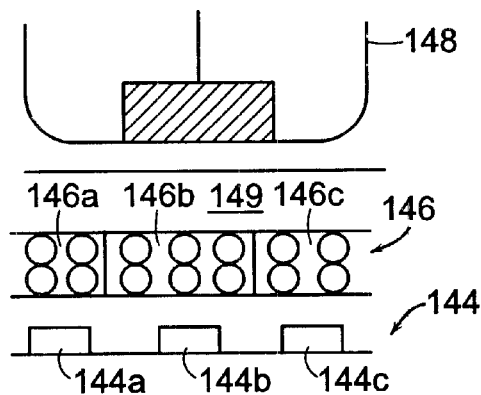
FIG. 14a shows a cross-sectional view of a portion of a display according one embodiment of the invention.
Figure 14B:
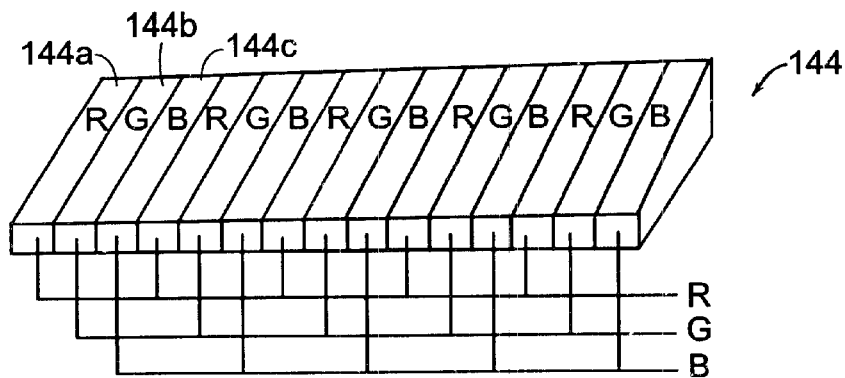
Figure 14C:
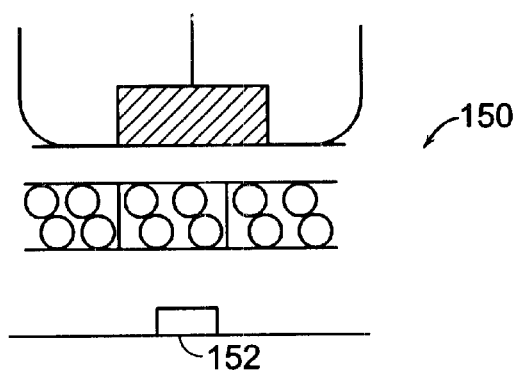
FIG. 14c shows a cross-sectional view of a portion of a display according one embodiment of the invention.

In one embodiment, the drawing system provides multiple optical properties, such as permitting the user to draw in multiple colors. Referring to FIGS. 14a and 14b, the drawing system 140 includes a pixelated rear electrode 144. The rear electrode 144 is patterned into multiple pixel or line electrodes 144a, 144b, 144c. In one detailed embodiment, the pixel or line electrodes 144a, 144b, 144c have a width of less than about 1 mm. The first electrodes 144a correspond to a first optical property (e.g., red), the second electrodes 144b correspond to a second optical property (e.g., green), and the third electrodes 144c correspond to a third optical property (e.g., blue). The drawing system 140 further includes an encapsulated display media 146, which includes particles or solvent of different optical properties, such as color. For example, the display media 146 can include particles or solvent of red, green, and blue, or cyan, magenta, and yellow. In one detailed embodiment, a capsule adjacent the first electrode 144a includes white particles and a red dye, a capsule adjacent the second electrode 144b includes white particles and a green dye, and a capsule adjacent the third electrode 144c includes white particles and a blue dye. In this embodiment, the display media 146 adjacent the first electrode 144a forms a red region 146a. The display media 146 adjacent the second electrode 144b forms a green region 146b. The display media 146 adjacent the third electrode 144c forms a blue region 146c.

In order to draw in red, a voltage which differs from the voltage of the stylus 148 is applied to the pixel or line electrodes 144a corresponding to red. The electrodes 144a are connected to a common red electrode. The stylus 148 and the rear electrodes 144a establish an electric field across the display media 146, such that white particles migrate away from the protective layer 149 and displaying the color of the red dye. A voltage that matches the voltage of the stylus 148 is applied to the pixel or line electrodes 144b, 144c corresponding to green and blue, such that an electric field across the green region 146b and the blue region 146c cannot be established. The second electrodes 144b are connected to a common green electrode. The third electrodes 144c are connected to a common blue region. The stylus 148, therefore, does not electrophoretically affect any media except the media corresponding to the red regions 146a. By setting the rear electrodes at differing voltage potentials, various color effects (such as color combinations) may be achieved.

In one embodiment, a pixelated rear electrode is created by providing a dielectric substrate of one or more layers in which multiple electrodes corresponding to the same color are provided on a single layer and connected in parallel. Alternatively, the pixelated electrodes can be provided on a single substrate.

In another embodiment, the drawing system 150 includes a display media 154 comprising a red region 154a, a green region 154b, and a blue region 154c as substantially described with respect to FIG. 14a, and a movable rear electrode 152 which addresses one of the three regions 154a, 154b, 154c at a time. When the movable rear electrode 152 is placed adjacent a region, an electric field is applied to that region to display the color of that region. A mechanical switch can be used to move the electrode.

The embodiments of FIGS. 14a and 14b are provided as examples only. Other embodiments for providing a color display can be used in accordance with the present invention. Commonly-owned, co-pending U.S. patent application Ser. No. 09/140,862 filed Aug. 27, 1998, which describes color electrophoretic displays is incorporated herein by reference.

Figure 15A:
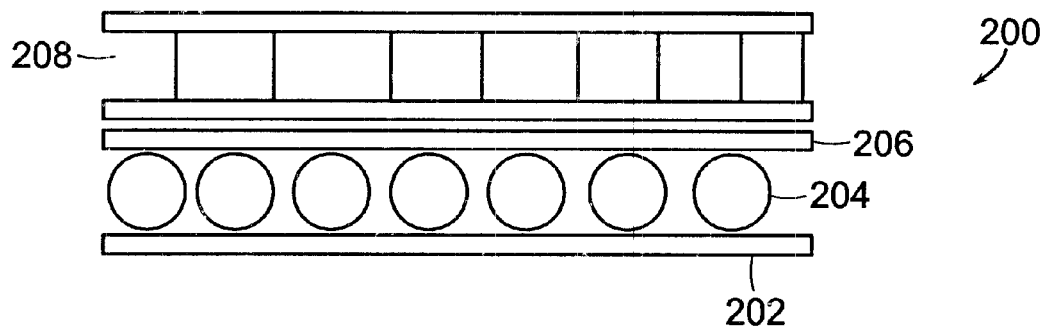
FIG. 15a shows a cross-sectional view of a display according to one embodiment of the invention.

Referring to FIG. 15a, a display 200 includes a rear electrode 202, a display media 204, a front electrode 206, and a touchscreen 208. The touchscreen 208 is disposed adjacent the front electrode 206. Alternatively, the touchscreen 208 can be laminated to or integrated with the display media 204. For example, one of the electrodes of the touchscreen can be applied directly on the front electrode 206 of the display 200. Touchscreens which operate through resistive and capacitive effects are known to those skilled in the art. In this embodiment, the display 200 is activated when a drawing instrument is pressed against the touchscreen 208. Alternatively, the touchscreen can be positioned behind the drawing system.

In one embodiment, the display of the present invention is incorporated into a data capture mechanism, such as a credit card authorization terminal. In this embodiment, a user signs his or her signature on a drawing surface of the display, and his or her signature is captured and digitized. In one example, the stylus or data source emits wireless waves that are received by a sensing mechanism underneath the microencapsulated electrophoretic layer and bottom electrode. In another example, the flexibility of the microencapsulated electrophoretic layer is utilized to permit localized pressure to transfer through the display media to a pressure-sensitive array or touch screen-type device in front of or behind the display media. One advantage of this embodiment is that while the signature or data tracing may be digitized at a coarse resolution, its image is displayed in analog by the display media at higher resolutions. In another example, the stylus or data source emits infrared or visible signals that transfer through the display media to a sensing mechanism; here the wide temperature operating range of microencapsulated electrophoretic displays is useful. In another example, the stylus transmits acoustic waves that are again sensed by a mechanism behind the display media. The sensing mechanism describe above can provide information about the location of the instrument on the display.

Figure 15B:
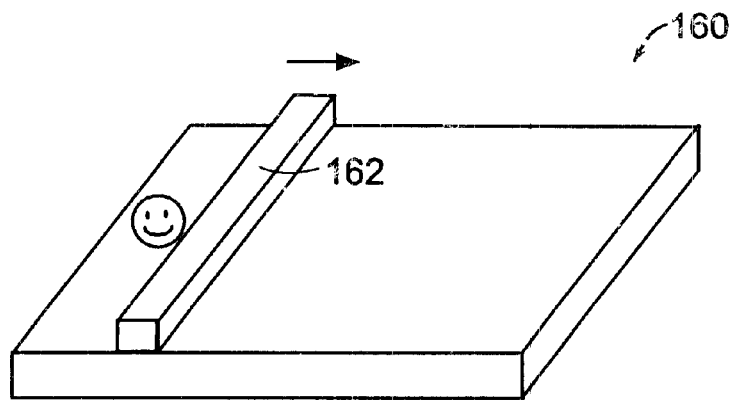
FIG. 15b shows a perspective view of a display according one embodiment of the invention.

Referring to FIG. 15b, the display 160 includes an electrostatic printing mechanism. The electrostatic printing mechanism is included in a sliding bar 162, which may have one or more electrodes. The electrodes are connected to a driving mechanism such as an integrated circuit. The electrodes can also be connected to a data source such as a data storage device or a communications device. The communications device can be, for example, a pager, a receiver, a modem, an infrared port or direct cable connection. The sliding bar 162 can further include logic circuitry and position sensors. In this embodiment, the sliding bar can be used as a manual or automatic electrostatic print head and can transfer images to the drawing screen when the user slides the sliding bar 162. The system 100 can further include mechanical or optic speed sensing device to detect the manual scanning of the print head.

The display 160 of FIG. 15b allows a user to download and display an image on the drawing screen. The image can be text (newspaper, book, e.g.), a dotted line image, a partial image, an image from a scrapbook or database, or even an interactive series of images. When equipped with a communications device and appropriate logic circuitry, the drawing device thereby can serve as a low-cost information display device such as an extremely cheap web browser.

In another embodiment, the sliding bar 162 supports a scanning device. The scanning device can digitize the image provided on the screen of the drawing system. When used in combination with a data storage device, memory device, or communications device, this will allow the drawing system to store, recall and transmit images. Alternatively, an external scanning device can be used with the display 10 system.

Figure 16A:
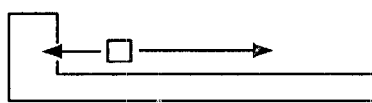
FIGS. 16a–16f show various methods of addressing a display with an electrode.
Figure 16B:
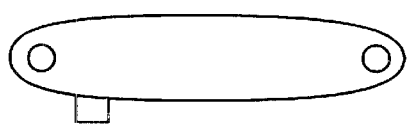
Figure 16C:
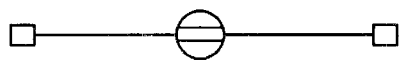
Figure 16D:
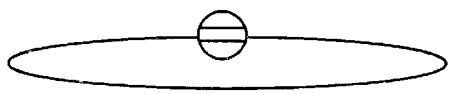
Figure 16E:
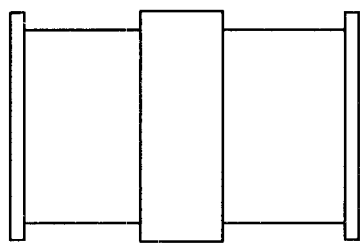
Figure 16G:
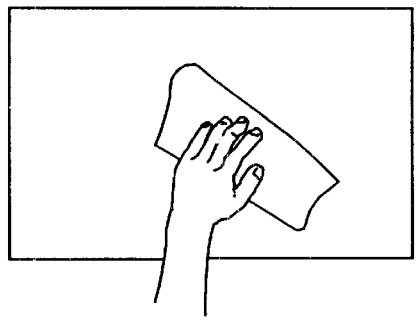
Figure 16F:
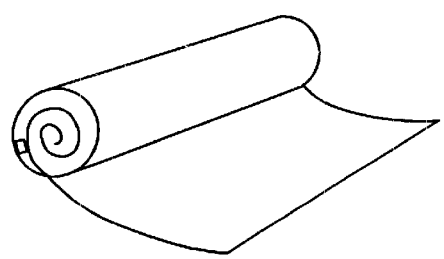

In one embodiment, the sliding bar 162 slides across the screen as shown in FIG. 16a or is manually moved across the screen as shown in FIG. 16g to erase, scan, or draw. Alternatively, the screen of the drawing system can be moved relative to an electrode to perform the same functions. For example, the screen can be provided in a conveyor belt-like construction, where the screen moves as shown in FIG. 16b, or where the electrode moves as shown in FIG. 16d. Alternatively, the screen can be pulled out of a roll of display media as with a window shutter as shown in FIG. 16f, or the screen can be pulled through the sliding bar from side to side as shown in FIGS. 16c and 16e.

Figure 17:
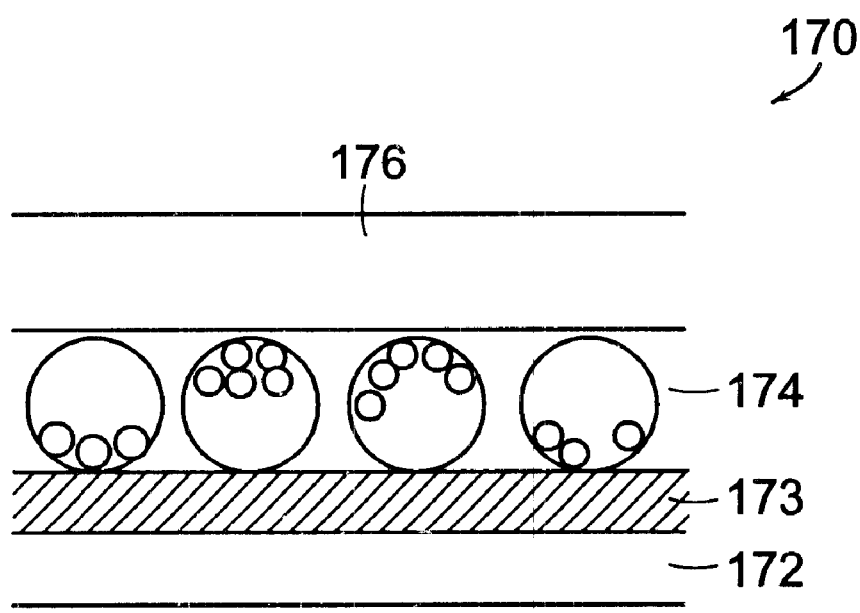
FIG. 17 shows a cross-sectional view of a display according to one embodiment of the invention.

Referring to FIG. 17, a display system 170 includes a clear rear conductive electrode 172, a photoconductive dispersion layer 173, an encapsulated display media 174, and a top electrode 176. By providing a clear rear electrode 172, a photoconductive layer 173, and by adding appropriate logic, the display system 170 can "pick up" images from light-reflecting or light-emitting sources. The light 178 from an image displayed on a light-reflecting or light-emitting source strikes the photoconductive layer 173, causing the rear electrode 172 along with the top electrode 176 to apply an electric field across the display media 174, and thereby reproduce the picked up image on the display system 170. The means for generating the electric field can be built internally or externally to the display system. The system 170 can further include a light source (e.g., fluorescent light) for illuminating the substrate which reflects the light. The light-reflecting substrate can be paper. The details of a display system including a photoconductive electrode are provided in commonly-owned co-pending U.S. patent application Ser. No. 09/272,716, filed on Mar. 18, 1999.

In one embodiment in which the display system 170 lacks a top electrode 176, the user of the display system 170 can hold the display system 170 up to a light emitting display, such as a television or computer screen, move a sliding bar described above (not shown) across the top surface of the system 170, and thereby cause the display system 170 to reproduce the image on the television or computer screen. In another embodiment, in which the display system 170 includes the top electrode 176, the user simply places the display system 170 in front of the television or computer screen to capture the image shown on the television or computer screen. Alternatively, a light source internal or external to the display system 170 can illuminate a substrate and capture light-reflecting from the substrate, thereby copying the image on the substrate. Such system can be used as a toy, or as a novel way of transporting temporary images. For instance, a user can hold an electronic paper to his or her computer screen, image his or her day's agenda, and then carry this paper throughout the day.

The term "display" and the term "drawing system" have been used interchangably herein. Both terms include devices capable of providing drawing, copying, printing, or erasing functions. The term "movable electrode" as used herein includes a writing device, an eraser, a printer, or a scanner. The "movable electrode" also refers to an electrode capable of moving relative to a display surface by either moving the electrode or moving the display.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A display comprising:
   an encapsulated electrophoretic display media comprising a belt loop and containing a plurality of capsules, each capsule comprising a plurality of electrophoretic particles dispersed in a fluid, the display media having a first surface and a second surface, the belt loop adapted to loop around at least a pair of rollers;
   a rear electrode disposed inside the belt loop and between the first surface and the second surface of the display media; and
   a movable electrode, in conjunction with the rear electrode, applying an electric field across the display media.

2. The display of claim 1 wherein the movable electrode comprises a writing device.

3. The display of claim 2 wherein the writing device comprises a charge generator.

4. The display of claim 3 wherein the charge generator further comprises an electronic circuit capable of increasing a voltage from about 20 V to about 1000 V.

5. The display of claim 4 wherein the charge generator further comprises an electronic circuit which reduces an applied voltage to zero after a predetermined time interval.

6. The display of claim 3 wherein the writing device includes an activator which activates the charge generator.

7. The display of claim 6 wherein the activator comprises a piezoelectric device.

8. The display of claim 3 wherein the charge generator comprises one of Van de Graaff device, triboelectric mechanism, and a hand-driven electric generator.

9. The display of claim 2 wherein the writing device comprises a charge storage device.

10. The display of claim 2 wherein the writing device comprises a stylus.

11. The display of claim 10 wherein the stylus comprises an electrode tip disposed within a curved end of the stylus.

12. The display of claim 10 wherein the stylus comprises a plurality of concentric electrodes.

13. The display of claim 10 wherein the stylus comprises a dielectric coating covering the electrode tip.

14. The display of claim 10 wherein the stylus comprises an elastomeric material.

15. The display of claim 2 wherein the writing device has a first end and a second end, wherein the display media displays a first color when the first end is disposed adjacent the first surface of the display media and a second color when the second end is disposed adjacent the first surface of the display media.

16. The display of claim 2 wherein the writing device emits one of infrared, visible light, or acoustic energy.

17. The display of claim 1 further comprising a protective layer disposed adjacent one of the surfaces of the display media.

18. The display of claim 1 wherein the encapsulated display media comprises a binder which is substantially ultraviolet light protective.

19. The display of claim 1 wherein the movable electrode comprises an eraser.

20. The display of claim 1 further comprising a dielectric layer disposed adjacent one of the surfaces of the display media.

21. The display of claim 1 wherein the movable electrode comprises a plurality of insulated electrodes.

22. The display of claim 1 wherein the movable electrode comprises a sliding bar, which slides across the first surface of the display media.

23. The display of claim 22 wherein the sliding bar comprises a charge generator.

24. The display of claim 23 wherein the sliding bar comprises an activator which activates the charge generator.

25. The display of claim 22 wherein the sliding bar is in communication with a data storage device.

26. The display of claim 22 wherein the sliding bar comprises a data storage device.

27. The display of claim 22 wherein the sliding bar comprises a scanner.

28. The display of claim 22 wherein the sliding bar comprises an eraser.

29. The display of claim 1 further comprising a piezoelectric film disposed adjacent one of the surfaces of the display media.

30. The display of claim 1 wherein the movable electrode comprises a switch which reverses an electric field applied to the display media upon activation of the switch.

31. The display of claim 30 wherein a color displayed on the first surface of the display media changes upon activation of the switch.

32. The display of claim 1 wherein the movable electrode comprises a stamp.

33. The display of claim 1 wherein the movable electrode comprises a user's hand.

34. The display of claim 1 wherein the display media further comprises a top electrode disposed over a portion of one of the surfaces of the display media.

35. The display of claim 1 wherein the display media is flexible.

36. The display of claim 1 wherein the rear electrode comprises a polymer layer and a conductive coating.

37. The display of claim 36 wherein the rear electrode is flexible.

38. The display of claim 1 wherein the movable electrode comprises an electrostatic print head.

39. The display of claim 35 further comprising a speed sensor.

40. The display of claim 38 further comprising a logic circuit for driving the electrostatic print head.

41. The display of claim 1 wherein the rear electrode comprises a first region having a voltage different from a voltage of the movable electrode and a second region having a voltage matching the voltage of the movable electrode.

42. The display of claim 1 further comprising a casing containing a removable display media.

43. The display of claim 1 further comprising a casing containing the display media and a removable rear electrode.

44. The display of claim 1 wherein the rear electrode is disposed on an inner surface of the belt loop.

45. The display of claim 1 wherein the rear electrode comprises a conductive pattern.

46. The display of claim 1 wherein the plurality of electrophoretic particles comprise a plurality of colors, and wherein the rear electrode comprises a plurality of pixel electrodes, each pixel electrode being set at a voltage for displaying particles of a selected color on the first surface of the display media.

47. The display of claim 1 wherein the rear electrode is movable.

48. The display of claim 1 further comprising a touchscreen disposed adjacent the first surface of the display media.

49. The display of claim 1 further comprising a touchscreen disposed adjacent to the rear electrode.

50. The display of claim 1 wherein the rear electrode comprises a first region and a second region, and a voltage applied to the first region differs from a voltage applied to the second region.

51. The display of claim 1 further compromising a writing implement comprising a substrate, and a conductor pattern disposed on the substrate, wherein an image corresponding to the conductor pattern appears on the first surface of the display media when a moving electrode comes in contact with a portion of the conductor pattern, and the image remains on the display media upon removal of the writing implement.

52. The display of claim 51 wherein the conductor pattern comprises a transparent conductor pattern.

53. The display of claim 51 wherein the substrate comprises an inner edge defining a cut out portion, a portion of the inner edge being in electrical contact with the conductor pattern, such that the image corresponding to the conductor pattern appears on the first surface of the display when the writing implement comes in contact with the display media through the cut out portion.

54. The display of claim 1 wherein at least one of the first and the second surfaces is a drawing surface.

55. A method for creating an image on a display comprising the steps of:
   a) providing a display including an encapsulated electrophoretic display media comprising a belt loop and containing a plurality of capsules, each capsule comprising a plurality of electrophoretic particles dispersed in a fluid, the display media having a first surface and a second surface, and a rear electrode disposed inside the belt loop and between the first surface and the second surface of the display media;
   b) placing a movable electrode adjacent the first surface of the display media;
   c) applying an electric field across the display media through the movable electrode and the rear electrode, thereby creating an image on the first surface of the display media;
   d) looping the belt loop of the display media around at least a pair of rollers; and
   e) rolling the rollers to cause the display media to roll.

56. The method of claim 55 further comprising step f) selecting a line width of the image through a switch disposed on the movable electrode.

57. The method of claim 55 wherein step (c) comprises applying a first electric field to create an image comprising a first color and applying a second electric field to create an image comprising a second color.

58. The method of claim 55 wherein step (c) comprises sliding an electrostatic print head across the first surface of the display media.

59. The method of claim 55 wherein step c) comprises creating an image on the writing system by drawing with a user's hand.

60. The method of claim 55, further comprising providing a sliding bar that slides across the first surface of the display media.

61. The method of claim 60 wherein the sliding bar is stationary but slides across the first surface of the display media as the display media rolls past the sliding bar.

62. The method of claim 60 wherein the sliding bar comprises a charge generator.

63. The method of claim 60 further comprising using the sliding bar to erase at least a portion of the image.

64. The method of claim 60 further comprising using the sliding bar to draw at least a portion of the image.

65. The method of claim 60 further comprising using the sliding bar to scan at least a portion of the image.

66. The method of claim 60 further comprising using the sliding bar to store at least a portion of the image.

67. The method of claim 55 wherein the display further comprises a protective layer disposed adjacent one of the surfaces of the display media.

68. The method of claim 55 wherein the rear electrode is disposed on an inner surface of the belt loop.

* * * * *